US012367164B2

(12) United States Patent
Gopal et al.

(10) Patent No.: US 12,367,164 B2
(45) Date of Patent: Jul. 22, 2025

(54) CIRCUITRY AND METHODS FOR LOW-LATENCY PAGE DECOMPRESSION AND COMPRESSION ACCELERATION

(71) Applicant: Intel Corporation, Santa Clara, CA (US)

(72) Inventors: Vinodh Gopal, Westborough, MA (US); George Powley, Northborough, MA (US)

(73) Assignee: Intel Corporation, Santa Clara, CA (US)

( * ) Notice: Subject to any disclaimer, the term of this patent is extended or adjusted under 35 U.S.C. 154(b) by 970 days.

(21) Appl. No.: 17/134,118

(22) Filed: Dec. 24, 2020

(65) Prior Publication Data

US 2022/0206975 A1   Jun. 30, 2022

(51) Int. Cl.
G06F 13/28 (2006.01)
H03M 7/30 (2006.01)

(52) U.S. Cl.
CPC ............. *G06F 13/28* (2013.01); *H03M 7/60* (2013.01)

(58) Field of Classification Search
None
See application file for complete search history.

(56) References Cited

U.S. PATENT DOCUMENTS

| 6,523,102 | B1 * | 2/2003 | Dye | ........................ | G06F 12/08 711/170 |
| 10,366,026 | B1 | 7/2019 | Diamant et al. | | |
| 2001/0052038 | A1 * | 12/2001 | Fallon | ................... | G06F 3/0658 710/22 |
| 2019/0095343 | A1 | 3/2019 | Gopal | | |
| 2020/0272565 | A1 | 8/2020 | Klein et al. | | |
| 2022/0035775 | A1 * | 2/2022 | Sriharsha | ............ | G06F 18/2115 |

OTHER PUBLICATIONS

European Search Report and Search Opinion, EP App. No. 21198158.4, Apr. 4, 2022, 7 pages.
Lagar-Cavilla et al., "Software-Defined Far Memory in Warehouse-Scale Computers", ASPLOS'19, ACM, Apr. 13-17, 2019, pp. 317-330.
Intention to Grant, EP App. No. 21198158.4, Jul. 5, 2024, 6 pages.
Office Action, EP App. No. 21198158.4, Apr. 24, 2024, 04 pages.

* cited by examiner

*Primary Examiner* — Idriss N Alrobaye
*Assistant Examiner* — Dayton Lewis-Taylor
(74) *Attorney, Agent, or Firm* — NICHOLSON DE VOS WEBSTER & ELLIOTT LLP

(57) ABSTRACT

Systems, methods, and apparatuses to low-latency page decompression and compression acceleration are described. In one embodiment, a system on a chip (SoC) includes a hardware processor core, and an accelerator circuit coupled to the hardware processor core, the accelerator circuit comprising a decompressor circuit and a direct memory access circuit to: in response to a first descriptor sent from the hardware processor core, cause the decompressor circuit to decompress compressed data from the direct memory access circuit into decompressed data and store the decompressed data in a buffer in the accelerator circuit, and in response to a second descriptor sent from the hardware processor core separately from the first descriptor, cause the decompressed data to be written from the buffer to memory external to the accelerator circuit by the direct memory access circuit.

15 Claims, 24 Drawing Sheets

FIG. 4

DESCRIPTOR 400

| Byte 7 | Byte 6 | Byte 5 | Byte 4 | Byte 3 | Byte 2 | Byte 1 | Byte 0 | bytes |
|---|---|---|---|---|---|---|---|---|
| Operation | | Flags | | Pv / Ignored | | PASID | | 0 |
| Completion Record Address | | | | | | | | 8 |
| Source Address | | | | | | | | 16 |
| Destination Address | | | | | | | | 24 |
| Transfer Size | | | | | | | | 32 |
| Completion Interrupt Handle | | | | | | | | 40 |
| Operation-specific fields | | | | | | | | 48 |
| | | | | | | | | 56 |

OPERATION CODE 402

DESCRIPTOR 600

| Byte 7 | Byte 6 | Byte 5 | Byte 4 | Byte 3 | Byte 2 | Byte 1 | Byte 0 | bytes |
|---|---|---|---|---|---|---|---|---|
| DECOMP-JOB2 | | Flags | | Pry / Ignored | | PASID | | 0 |
| | | | | | | | | 8 |
| Completion Record Address | | | | | | | | 16 |
| Source Address | | | | | | | | 24 |
| Correct / Valid Destination Address 604 | | | | | | | | 32 |
| Completion Interrupt Handle | | | Transfer Size | | | | | 40 |
| Operation-specific fields | | | | | | | | 48 |
| | | | | | | | | 56 |

OPERATION CODE 602 → DECOMP-JOB2

```
┌─────────────────────────────────────────────────────────────────────────────┐
│ ACCELERATOR RECEIVES JOB1 WITH A SPECIAL OPCODE, AND IN RESPONSE, IT LOCKS AN│
│ AVAILABLE DECOMPRESSOR CIRCUIT (E.G., PIPELINE) (E.G., AND STORES THE RELEVANT│
│ IDENTIFYING INFORMATION IN A NEW MAPPING TABLE FOR LOCKED PIPELINES) 702    │
└─────────────────────────────────────────────────────────────────────────────┘
                                    ↓
┌─────────────────────────────────────────────────────────────────────────────┐
│ DIRECT MEMORY ACCESS CIRCUIT OF THE ACCELERATOR IS SETUP FOR READING AN INPUT│
│                 STREAM OF COMPRESSED DATA 704                                │
└─────────────────────────────────────────────────────────────────────────────┘
                                    ↓
┌─────────────────────────────────────────────────────────────────────────────┐
│ DECOMPRESSOR CIRCUIT (E.G., PIPELINE) IS SETUP TO SUPPRESS GENERATING AN OUTPUT│
│               STREAM OF DECOMPRESSED DATA 706                                │
└─────────────────────────────────────────────────────────────────────────────┘
                                    ↓
┌─────────────────────────────────────────────────────────────────────────────┐
│ DECOMPRESSION OPERATION PROCEEDS CONSUMING THE INPUT STREAM OF COMPRESSED   │
│ DATA AND GENERATING DECOMPRESSED DATA WHICH IS WRITTEN TO THE LOCAL HISTORY │
│           BUFFER MEMORY IN THE DECOMPRESSOR CIRCUIT 708                     │
└─────────────────────────────────────────────────────────────────────────────┘
                                    ↓
┌─────────────────────────────────────────────────────────────────────────────┐
│ IN PARALLEL WITH THE ABOVE, SOFTWARE WILL FIND AN AVAILABLE LOCATION IN MEMORY│
│ FOR THE DECOMPRESSED DATA (E.G., DESTINATION FREE PAGE) AND SUBMIT JOB2 710 │
└─────────────────────────────────────────────────────────────────────────────┘
                                    ↓
┌─────────────────────────────────────────────────────────────────────────────┐
│ ACCELERATOR RECEIVES JOB2 WITH A SPECIAL OPCODE, AND IN RESPONSE, ROUTES THIS│
│      JOB TO THE LOCKED DECOMPRESSOR CIRCUIT (E.G., PIPELINE) 712            │
└─────────────────────────────────────────────────────────────────────────────┘
                                    ↓
┌─────────────────────────────────────────────────────────────────────────────┐
│ LOCKED DECOMPRESSOR CIRCUIT (E.G., PIPELINE) ENTERS INTO A SPECIAL "DUMP-STATE"│
│ MODE, AND EMPTIES THE LOCAL HISTORY BUFFER MEMORY (E.G., AT HIGH SPEED) INTO THE│
│ OUTPUT STREAM, AND THE DMA CIRCUIT IS SETUP TO TRANSFER THE DECOMPRESSED DATA TO│
│ THE MEMORY USING THE SPECIFIED DESTINATION ADDRESS OF THE AVAILABLE LOCATION 714│
└─────────────────────────────────────────────────────────────────────────────┘
                                    ↓
┌─────────────────────────────────────────────────────────────────────────────┐
│                COMPLETION (E.G., INTERRUPT) IS SIGNALED 716                 │
└─────────────────────────────────────────────────────────────────────────────┘
                                    ↓
┌─────────────────────────────────────────────────────────────────────────────┐
│ DECOMPRESSOR CIRCUIT (E.G., PIPELINE) IS UNLOCKED (E.G., AND MAPPING TABLE CLEARED)│
│                                    718                                      │
└─────────────────────────────────────────────────────────────────────────────┘
```

```
┌─────────────────────────────────────────────────────────────────────────┐
│ SENDING, BY A HARDWARE PROCESSOR CORE OF A SYSTEM, A FIRST DESCRIPTOR TO AN │
│ ACCELERATOR CIRCUIT COUPLED TO THE HARDWARE PROCESSOR CORE AND HAVING A │
│ DECOMPRESSOR CIRCUIT AND A DIRECT MEMORY ACCESS CIRCUIT                 │
│                              1002                                        │
└─────────────────────────────────────────────────────────────────────────┘
                                    │
                                    ▼
┌─────────────────────────────────────────────────────────────────────────┐
│ IN RESPONSE TO RECEIVING THE FIRST DESCRIPTOR, DECOMPRESSING COMPRESSED │
│ DATA FROM THE DIRECT MEMORY ACCESS CIRCUIT INTO DECOMPRESSED DATA BY THE│
│ DECOMPRESSOR CIRCUIT AND STORING THE DECOMPRESSED DATA IN A BUFFER IN THE│
│                         ACCELERATOR CIRCUIT                              │
│                              1004                                        │
└─────────────────────────────────────────────────────────────────────────┘
                                    │
                                    ▼
┌─────────────────────────────────────────────────────────────────────────┐
│ SENDING, BY THE HARDWARE PROCESSOR CORE OF THE SYSTEM, A SECOND         │
│ DESCRIPTOR TO THE ACCELERATOR CIRCUIT SEPARATELY FROM THE FIRST DESCRIPTOR│
│                              1006                                        │
└─────────────────────────────────────────────────────────────────────────┘
                                    │
                                    ▼
┌─────────────────────────────────────────────────────────────────────────┐
│ IN RESPONSE TO RECEIVING THE SECOND DESCRIPTOR, WRITING THE DECOMPRESSED│
│ DATA FROM THE BUFFER TO MEMORY EXTERNAL TO THE ACCELERATOR CIRCUIT BY THE│
│                    DIRECT MEMORY ACCESS CIRCUIT                          │
│                              1008                                        │
└─────────────────────────────────────────────────────────────────────────┘
```

FIG. 10

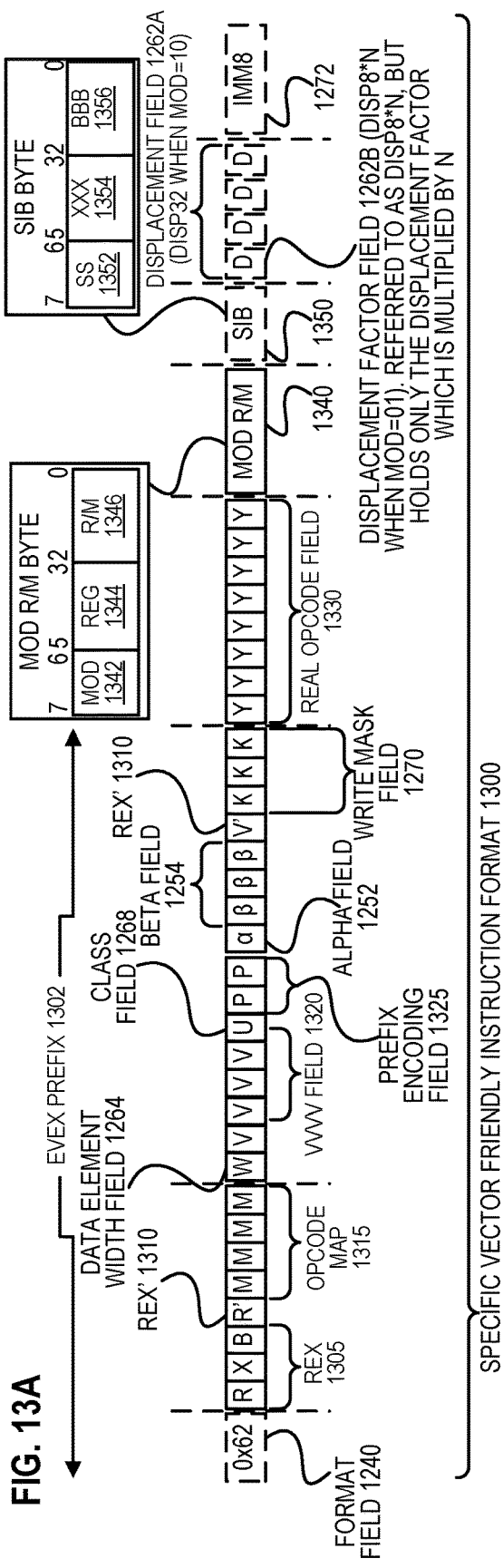
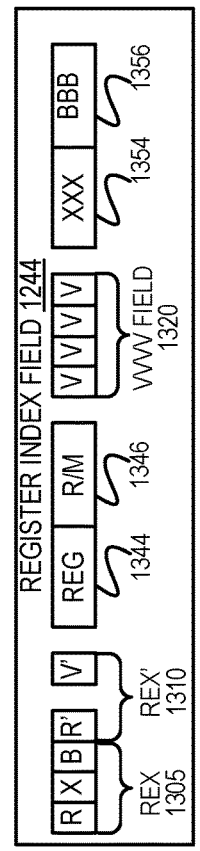
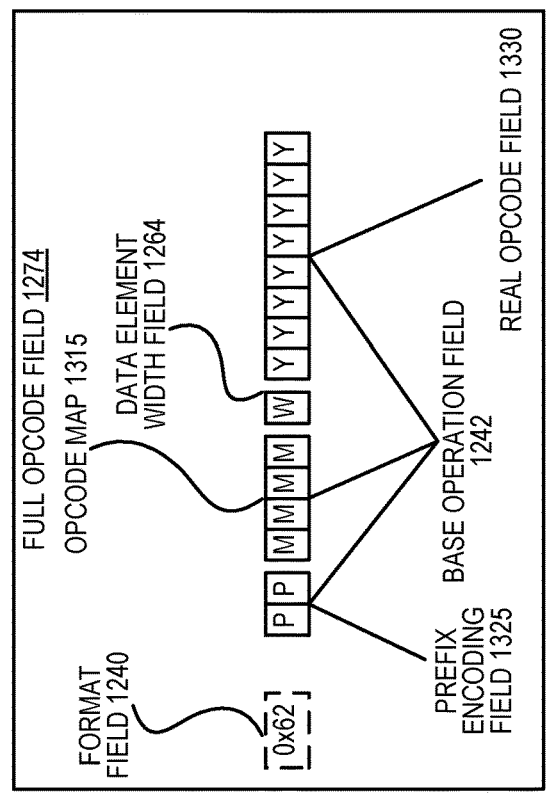
FIG. 13A
FIG. 13B
FIG. 13C

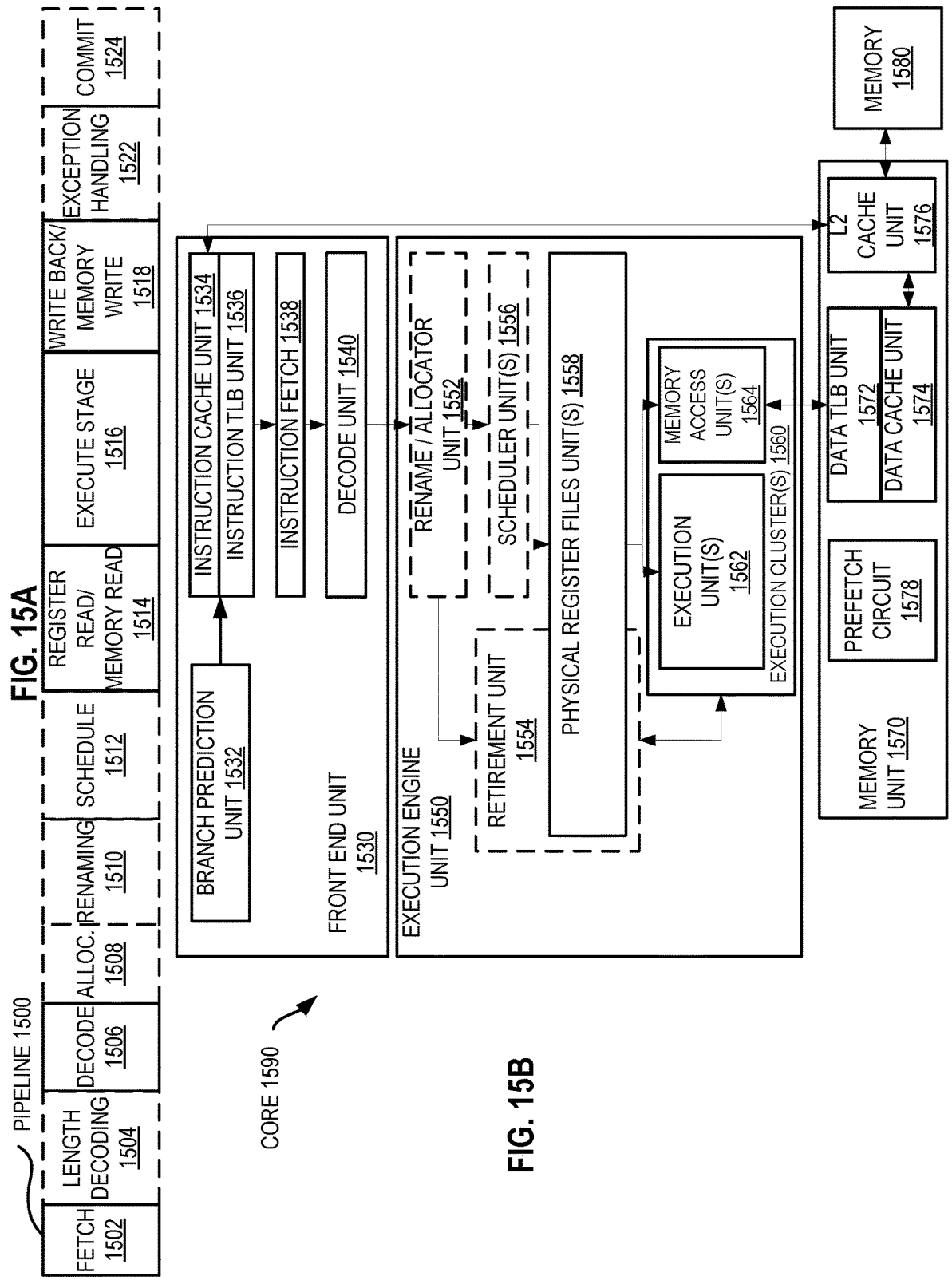

CIRCUITRY AND METHODS FOR LOW-LATENCY PAGE DECOMPRESSION AND COMPRESSION ACCELERATION

TECHNICAL FIELD

The disclosure relates generally to electronics, and, more specifically, an embodiment of the disclosure relates to circuitry for low-latency page decompression and compression acceleration.

BACKGROUND

A processor, or set of processors, executes instructions from an instruction set, e.g., the instruction set architecture (ISA). The instruction set is the part of the computer architecture related to programming, and generally includes the native data types, instructions, register architecture, addressing modes, memory architecture, interrupt and exception handling, and external input and output (I/O). It should be noted that the term instruction herein may refer to a macro-instruction, e.g., an instruction that is provided to the processor for execution, or to a micro-instruction, e.g., an instruction that results from a processor's decoder decoding macro-instructions.

BRIEF DESCRIPTION OF THE DRAWINGS

The present disclosure is illustrated by way of example and not limitation in the figures of the accompanying drawings, in which like references indicate similar elements and in which:

FIG. 4 illustrates an example format of a descriptor according to embodiments of the disclosure.

FIG. 6 illustrates an example format of a descriptor including a destination address according to embodiments of the disclosure.

FIG. 7 is a flow diagram illustrating operations of a method of decompression according to embodiments of the disclosure.

FIG. 10 is a flow diagram illustrating operations of a method of decompression according to embodiments of the disclosure.

FIG. 13A is a block diagram illustrating fields for the generic vector friendly instruction formats in FIGS. 12A and 12B according to embodiments of the disclosure.

FIG. 13B is a block diagram illustrating the fields of the specific vector friendly instruction format in FIG. 13A that make up a full opcode field according to one embodiment of the disclosure.

FIG. 13C is a block diagram illustrating the fields of the specific vector friendly instruction format in FIG. 13A that make up a register index field according to one embodiment of the disclosure.

FIG. 15A is a block diagram illustrating both an exemplary in-order pipeline and an exemplary register renaming, out-of-order issue/execution pipeline according to embodiments of the disclosure.

FIG. 15B is a block diagram illustrating both an exemplary embodiment of an in-order architecture core and an exemplary register renaming, out-of-order issue/execution architecture core to be included in a processor according to embodiments of the disclosure.

DETAILED DESCRIPTION

Figure 1:
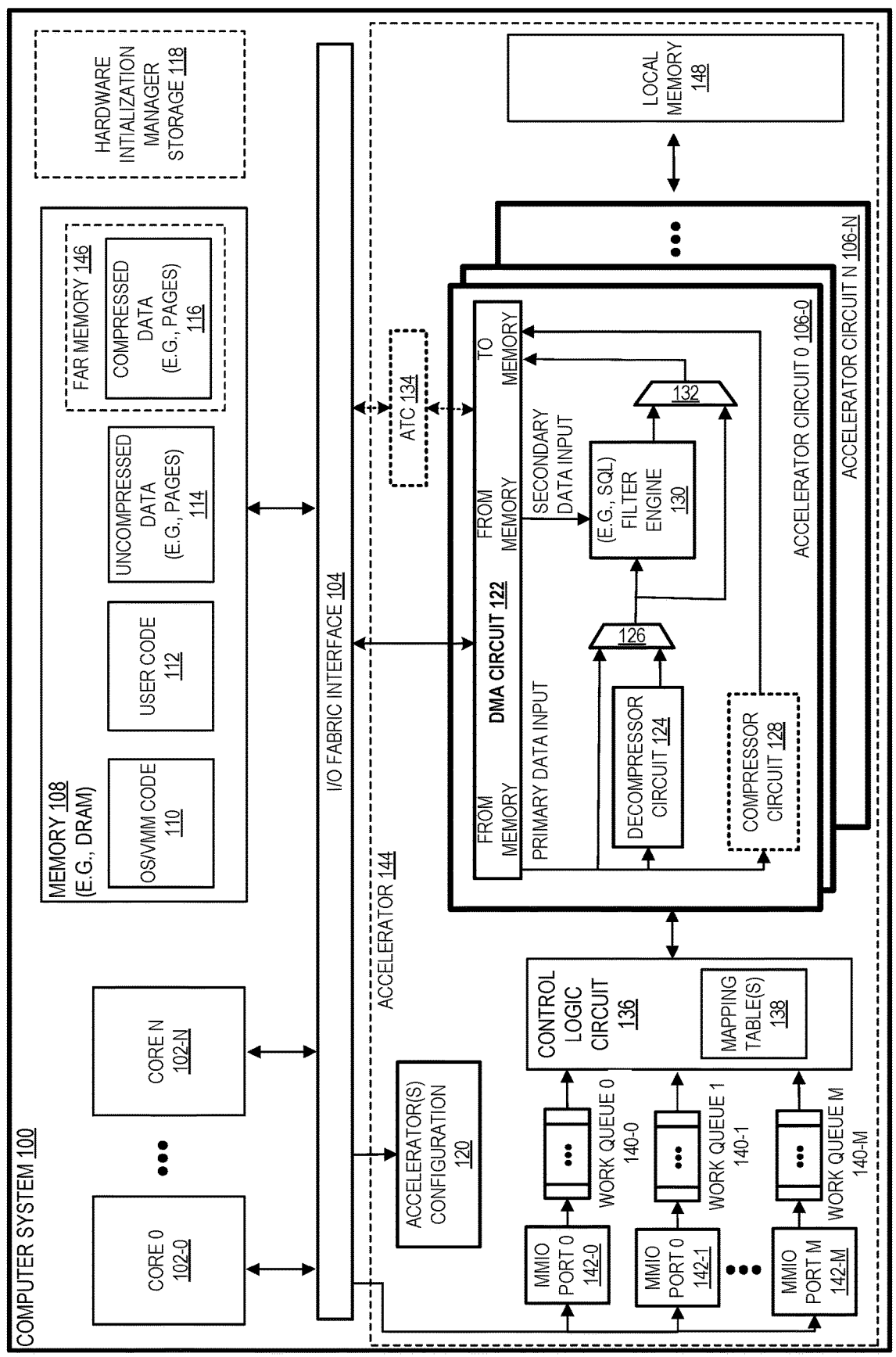
FIG. 1 illustrates a block diagram of a computer system including a plurality of cores, a memory, and an accelerator circuit including a decompressor circuit according to embodiments of the disclosure.

In the following description, numerous specific details are set forth. However, it is understood that embodiments of the disclosure may be practiced without these specific details. In other instances, well-known circuits, structures, and techniques have not been shown in detail in order not to obscure the understanding of this description.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

A (e.g., hardware) processor (e.g., having one or more cores) may execute instructions (e.g., a thread of instructions) to operate on data, for example, to perform arithmetic, logic, or other functions. For example, software may request an operation and a hardware processor (e.g., a core or cores thereof) may perform the operation in response to the request. Certain operations include accessing one or more memory locations, e.g., to store and/or read (e.g., load) data. A system may include a plurality of cores, e.g., with a proper subset of cores in each socket of a plurality of sockets, e.g., of a system-on-a-chip (SoC). Each core (e.g., each processor or each socket) may access data storage (e.g., a memory). Memory may include volatile memory (e.g., dynamic random-access memory (DRAM)) or (e.g., byte-addressable) persistent (e.g., non-volatile) memory (e.g., non-volatile RAM) (e.g., separate from any system storage, such as, but not limited, separate from a hard disk drive). One example of persistent memory is a dual in-line memory module (DIMM) (e.g., a non-volatile DIMM) (e.g., an Intel® Optane™ memory), for example, accessible according to a Peripheral Component Interconnect Express (PCIe) standard.

Certain embodiments utilize a "far memory" in a memory hierarchy, e.g., to store infrequently accessed (e.g., "cold") data into the far memory. Doing so allows certain system to perform a same operation(s) with a lower volatile memory (e.g., DRAM) capacity. Persistent memory may be used as a second tier of memory (e.g., "far memory"), e.g., with volatile memory (e.g., DRAM) being a first tier of memory (e.g., "near memory").

In one embodiment, a processor is coupled to an (e.g., on die or off die) accelerator (e.g., an offload engine) to perform one or more (e.g., offloaded) operations, for example, instead of those operations being performed only on the processor. In one embodiment, a processor includes an (e.g., on die or off die) accelerator (e.g., an offload engine) to perform one or more operations, for example, instead of those operations being performed only on the processor.

Two non-limiting examples of operations are a compression operation and a decompression operation. A compression operation may refer to encoding information using fewer bits than the original representation. A decompression operation may refer to decoding the compressed information back into the original representation. A compression operation may compress data from a first format to a compressed, second format. A decompression operation may decompress data from a compressed, first format to an uncompressed, second format. A compression operation may be performed according to an (e.g., compression) algorithm. A decompression operation may be performed according to an (e.g., decompression) algorithm.

In one embodiment, an accelerator performs a compression operation and/or decompression operation in response to a request to and/or for a processor (e.g., a central processing unit (CPU)) to perform that operation. An accelerator may be a hardware compression accelerator or a hardware decompression accelerator. An accelerator may couple to memory (e.g., on die with an accelerator or off die) to store data, e.g., the input data and/or the output data. An accelerator may utilize one or more buffers (e.g., on die with an accelerator or off die) to store data, e.g., the input data and/or the output data. In one embodiment, an accelerator couples to an input buffer to load input therefrom. In one embodiment, an accelerator couples to an output buffer to store output thereon. A processor may execute an instruction to offload an operation or operations (e.g., for an instruction, a thread of instructions, or other work) to an accelerator.

An operation may be performed on a data stream (e.g., stream of input data). A data stream may be an encoded, compressed data stream. In one embodiment, data is first compressed, e.g., according to a compression algorithm, such as, but not limited to, the LZ77 lossless data compression algorithm or the LZ78 lossless data compression algorithm. In one embodiment, a compressed symbol that is output from a compression algorithm is encoded into a code, for example, encoded according to the Huffman algorithm (Huffman encoding), e.g., such that more common symbols are represented by code that uses fewer bits than less common symbols. In certain embodiments, a code that represents (e.g., maps to) a symbol includes fewer bit in the code than in the symbol. In certain embodiments of encoding, each fixed-length input symbol is represented by (e.g., maps to) a corresponding variable-length (e.g., prefix free) output code (e.g., code value).

The DEFLATE data compression algorithm may be utilized to compress and decompress a data stream (e.g., data set). In certain embodiments of a DEFLATE compression, a data stream (e.g., data set) is divided into a sequence of data blocks and each data block is compressed separately. An end-of-block (EOB) symbol may be used to denote the end of each block. In certain embodiments of a DEFLATE compression, the LZ77 algorithm contributes to DEFLATE compression by allowing repeated character patterns to be represented with (length, distance) symbol pairs where a length symbol represents the length of a repeating character pattern and a distance symbol represents its distance, e.g., in bytes, to an earlier occurrence of the pattern. In certain embodiments of a DEFLATE compression, if a character pattern is not represented as a repetition of its earlier occurrence, it is represented by a sequence of literal symbols, e.g., corresponding to 8-bit byte patterns.

In certain embodiments, Huffman encoding is used in DEFLATE compression for encoding the length, distance, and literal symbols, e.g., and end-of-block symbols. In one embodiment, the literal symbols (e.g., values from 0 to 255), for example, used for representing all 8-bit byte patterns, together with the end-of-block symbol (e.g., the value 256) and the length symbols (e.g., values 257 to 285), are encoded as literal/length codes using a first Huffman code tree. In one embodiment, the distance symbols (e.g., represented by the values from 0 to 29) are encoded as distance codes using a separate, second Huffman code tree. Code trees may be stored in a header of the data stream. In one embodiment, every length symbol has two associated values, a base length value and an additional value denoting the number of extra bits to be read from the input bit-stream. The extra bits may be read as an integer which may be added to the base length value to give the absolute length represented by the length symbol occurrence. In one embodiment, every distance symbol has two associated values, a base distance value and an additional value denoting the number of extra bits to be read from the input bit-stream. The base distance value may be added to the integer made up of the associated number of extra bits from the input bit-stream to give the absolute distance represented by the distance symbol occurrence. In one embodiment, a compressed block of DEFLATE data is a hybrid of encoded literals and LZ77 look-back indicators terminated by an end-of-block indicator. In one embodiment, DEFLATE may be used to compress a data stream and INFLATE may be used to decompress the data stream. INFLATE may generally refer to the decoding process that takes a DEFLATE data stream for decompression (and decoding) and correctly produces the original full-sized data or file. In one embodiment, a data stream is an encoded, compressed DEFLATE data stream, for example, including a plurality of literal codes (e.g., codewords), length codes (e.g., codewords), and distance codes (e.g., codewords).

In certain embodiments, when a processor (e.g., CPU) sends work to a hardware accelerator (e.g., device), the processor (e.g., CPU) creates a description of the work to be completed (e.g., a descriptor) and submits it to the hardware accelerator. In certain embodiments, the descriptor is sent by a (e.g., special) instructions (e.g., job enqueue instructions) or via memory mapped input/output (MMIO) write transactions, for example, where an input/output MMIO (IOMMU) maps device (e.g., accelerator) visible virtual addresses (e.g., device addresses or I/O addresses) to corresponding physical addresses in memory. In certain embodiments, a page of memory (e.g., a memory page or virtual page) is a fixed-length contiguous block of virtual memory described by a single entry in a page table (e.g., in DRAM) that stores the mappings between virtual addresses and physical addresses (e.g., with the page being the smallest unit of data for memory management in a virtual memory operating system). A memory subsystem may include a translation lookaside buffer (e.g., TLB) (e.g., in a processor) to convert a virtual address to a physical address (e.g., of a system memory). A TLB may include a data table to store (e.g., recently used) virtual-to-physical memory address translations, e.g., such that the translation does not have to be performed on each virtual address present to obtain the physical memory address. If the virtual address entry is not in the TLB, a processor may perform a page walk in a page table to determine the virtual-to-physical memory address translation.

An example memory related usage for accelerators is (e.g., DRAM) memory tiering via compression, e.g., to provide fleetwide memory savings via page compression. In certain embodiments, this is done by an (e.g., supervisor level) operating system (OS) (or virtual machine monitor (VMM) or hypervisor) transparent to (e.g., user level) applications where system software tracks memory blocks (e.g., memory pages) that are frequently accessed (e.g., "hot") and infrequently accessed (e.g., "cold") (e.g., according to a hot/cold timing threshold(s) and a time elapsed since a block has been accessed), and compresses infrequently accessed (e.g., "cold") blocks (e.g., pages) into a compressed region of memory. In certain embodiments, when software attempts to access a block (e.g., page) of memory that is indicated as being infrequently accessed (e.g., "cold"), this results in a (e.g., page) fault, and the OS fault handler determines that a compressed version exists in the compressed region of memory (e.g., the special (e.g., "far") tier memory region), and in response, then submits a job (e.g., a corresponding descriptor) to a hardware accelerator (e.g., depicted in FIG. 1) to decompress this block (e.g., page) of memory (e.g., and cause that uncompressed data to be stored in the near memory (e.g., DRAM)).

Thus, the latency of this operation can directly impact the application performance significantly, especially when attempting to save larger capacity (e.g., in which case, the compressed tier could have some warmer pages that have greater adverse impact on performance).

Embodiments herein provide low-latency page decompression and compression acceleration. Certain embodiments herein focus on the end-to-end latency of a page miss, e.g., from the time the application raised a fault to the return from interrupt (e.g., indicating the page has now been loaded into the memory, e.g., from a hard drive (e.g., storage unit 1928 in FIG. 19) separate from the memory). However, decompression is an inherently sequential process, posing fundamental limits on processing speeds that cannot be overcome. In certain embodiments, the best mechanism to speed up the overall decompression of a page is to speculatively issue the decompress operation as early as possible. Before the decompression job is sent to an accelerator (e.g., decompressor circuit), certain embodiments locate the address of the compressed page (e.g., source address), and create a free page (e.g., in DRAM) whose address becomes the destination address, but this latter step can involve significant overhead and time, especially if the free page list is empty.

Embodiments herein reduce the end-to-end decompress latency by speculatively issuing a decompress job to an accelerator using just the source address, for example, while the destination address is yet to be determined (e.g., and happens in parallel with the decompression operation).

Certain embodiments for submitting jobs to a hardware accelerator involve creating a (e.g., decompress) descriptor with all of its operands specified accurately, e.g., including the destination address for the decompressed data. However, waiting for the destination address to be provided by system software (e.g., (OS/hypervisor) before a decompress operation can be started adds extra latencies.

Embodiments herein use a (e.g., "torn") new descriptor to define multiple related jobs for a hardware accelerator (e.g., a decompression circuit or engine). In certain embodiments, a first descriptor with the (e.g., virtual) source address is submitted to a hardware accelerator (e.g., by system software), but with a missing (e.g., or incorrect) (e.g., virtual) destination address for the result of the operation, e.g., the destination address is to be ignored for the first descriptor. The accelerator may then start to decompress the data (for example, a page's worth of output data (e.g., 4 kilobytes (KB) of output data), but in a special mode of suppressing the output (e.g., suppressing streaming out the output from the accelerator). In one embodiment, a hardware accelerator takes a certain time (e.g., about 1 micro-second (µs) for a decompression operation. During the decompression time, certain embodiments herein (e.g., in response to a system software finding a free page for the destination data) submit a second related job descriptor with the destination address (e.g., but an unused source address). A descriptor may include a special field to hold an identification (ID) value that matches the pair of related descriptors, or by using the source address to match up the pairs of related descriptors. In certain embodiments, when the second job descriptor is received, the accelerator writes out its stored decompressed data contents (e.g., stored within a history buffer memory within the accelerator), e.g., which can be done at a very high rate where this is a data movement over a wide interface bus (e.g., 32 or 64 bytes per cycle). When this is complete, in certain embodiments the accelerator unlocks that accelerator (e.g., the decompressor pipeline that processed this job pair), for example, where that accelerator (e.g., decompressor pipeline was locked after the first job of such a pair when it starts to execute and is (e.g., only) unlocked by executing the matching pair (or by an abort operation)).

Embodiments herein can thus hide the entire OS time related to finding/creating a destination page for decompress operation. For general usages and accelerator functions, embodiments herein are valuable to customers/users because it reduces the overhead and latency of using hardware accelerators, and lowers barriers of customer adoption and improves accelerator utilization. In one embodiment when used with (e.g., DRAM) memory tiering, saving the latency associated with decompressing a single block of data is critical. Embodiments herein are implemented with no change to an OS memory management scheme. Embodiments herein allow the implementation of the lowest latency decompression solution possible.

Turning now to FIG. 1, an example system architecture is depicted. FIG. 1 illustrates a block diagram of a computer system 100 including a plurality of cores 102-0 to 102-N (e.g., where N is any positive integer greater than one, although single core embodiments may also be utilized), a memory 108, and an accelerator circuit 106-0 (e.g., accelerator engine) including a decompressor circuit 124 according to embodiments of the disclosure. In certain embodiments, an accelerator 144 includes a plurality of accelerator circuits 106-0 to 106-N (e.g., where N is any positive integer greater than one, although single accelerator circuit embodiments may also be utilized).

Memory 102 may include operating system (OS) and/or virtual machine monitor code 110, user (e.g., program) code 112, uncompressed data (e.g., pages) 114, compressed data (e.g., pages) 116 or any combination thereof. In certain embodiments of computing, a virtual machine (VM) is an emulation of a computer system. In certain embodiments, VMs are based on a specific computer architecture and provide the functionality of an underlying physical computer system. Their implementations may involve specialized hardware, firmware, software, or a combination. In certain embodiments, the virtual machine monitor (VMM) (also known as a hypervisor) is a software program that, when executed, enables the creation, management, and governance of VM instances and manages the operation of a virtualized environment on top of a physical host machine. A VMM is the primary software behind virtualization environments and implementations in certain embodiments. When installed over a host machine (e.g., processor) in certain embodiments, a VMM facilitates the creation of VMs, e.g., each with separate operating systems (OS) and applications. The VMM may manage the backend operation of these VMs by allocating the necessary computing, memory, storage, and other input/output (I/O) resources, such as, but not limited to, an input/output memory management unit (IOMMU). The VMM may provide a centralized interface for managing the entire operation, status, and availability of VMs that are installed over a single host machine or spread across different and interconnected hosts.

Memory 108 may be memory separate from a core and/or accelerator. Memory 108 may be DRAM. Compressed data 116 may be stored in a first memory device (e.g., far memory 146) and/or uncompressed data 114 may be stored in a separate, second memory device (e.g., as near memory).

A coupling (e.g., input/output (I/O) fabric interface 104) may be included to allow communication between accelerator 144, core(s) 102-0 to 102-N, and memory 108.

In one embodiment, the hardware initialization manager (non-transitory) storage 118 stores hardware initialization manager firmware (e.g., or software). In one embodiment, the hardware initialization manager (non-transitory) storage 118 stores Basic Input/Output System (BIOS) firmware. In another embodiment, the hardware initialization manager (non-transitory) storage 118 stores Unified Extensible Firmware Interface (UEFI) firmware. In certain embodiments (e.g., triggered by the power-on or reboot of a processor), computer system 100 (e.g., core 102-0) executes the hardware initialization manager firmware (e.g., or software) stored in hardware initialization manager (non-transitory) storage 118 to initialize the system 100 for operation, for example, to begin executing an operating system (OS) and/or initialize and test the (e.g., hardware) components of system 100.

An accelerator 144 may include any of the depicted components. For example, with one or more instance of an accelerator circuit 106-0 to 106-N. In certain embodiments, a job (e.g., corresponding descriptor for that job) is submitted to the accelerator 144 via the work queues 140-0 to 140-M, e.g., where M is any positive integer greater than one, although work queue embodiments may also be utilized). In one embodiment, the number of work queues is the same as the number of accelerator circuits (e.g., engines). In certain embodiments, an accelerator configuration 120 (e.g., configuration value stored therein) causes accelerator 144 to be configured to perform one or more (e.g., decompression or compression) operations. In certain embodiments, control logic circuit 136 (e.g., in response to accelerator configuration 120) selects a job from a work queue and submits it to an accelerator circuit 106-0 to 106-N for one or more operations.

In the depicted embodiment, a (e.g., each) accelerator circuit 106-0 to 106-N includes a decompressor circuit 124 to perform decompression operations (see, e.g., FIG. 3), a compressor circuit 128 to perform compression operations, and a direct memory access (DMA) circuit 122, e.g., to connect to memory 108, internal memory (e.g., cache) of a core, and/or far memory 146. In one embodiment, compressor circuit 128 is (e.g., dynamically) shared by two or more of the accelerator circuits 106-0 to 106-N. In certain embodiments, the data for a job that is assigned to a particular accelerator circuit (e.g., accelerator circuit 106-0) is streamed in by DMA circuit 122, for example, as primary and/or secondary input. Multiplexers 126 and 132 may be utilized to route data for a particular operation. Optionally, a (e.g., Structured Query Language (SQL)) filter engine 130 may be included, for example, to perform a filtering query (e.g., for a search term input on the secondary data input) on input data, e.g., on decompressed data output from decompressor circuit 124.

In certain embodiments, mapping table(s) 138 are included to map a particular job (e.g., or a corresponding pair of descriptors for a logically single job) to a particular accelerator circuit 106-0 to 106-N. In certain embodiments, each work queue 140-0 to 140-M includes an MMIO port 142-0 to 142-N, respectively. In certain embodiments, a core sends a job (e.g., a descriptor) to accelerator 144 via one or more of the MMIO ports 142-0 to 142-N. Optionally, an address translation cache (ATC) 134 may be included, e.g., as a TLB to translate a virtual (e.g., source or destination) address to a physical address (e.g., in memory 108 and/or far memory 146). As discussed below, accelerator 144 may include a local memory 148, e.g., shared by a plurality of accelerator circuits 106-0 to 106-N. Computer system 100 may couple to a hard drive, e.g., storage unit 1928 in FIG. 19.

Figure 2:
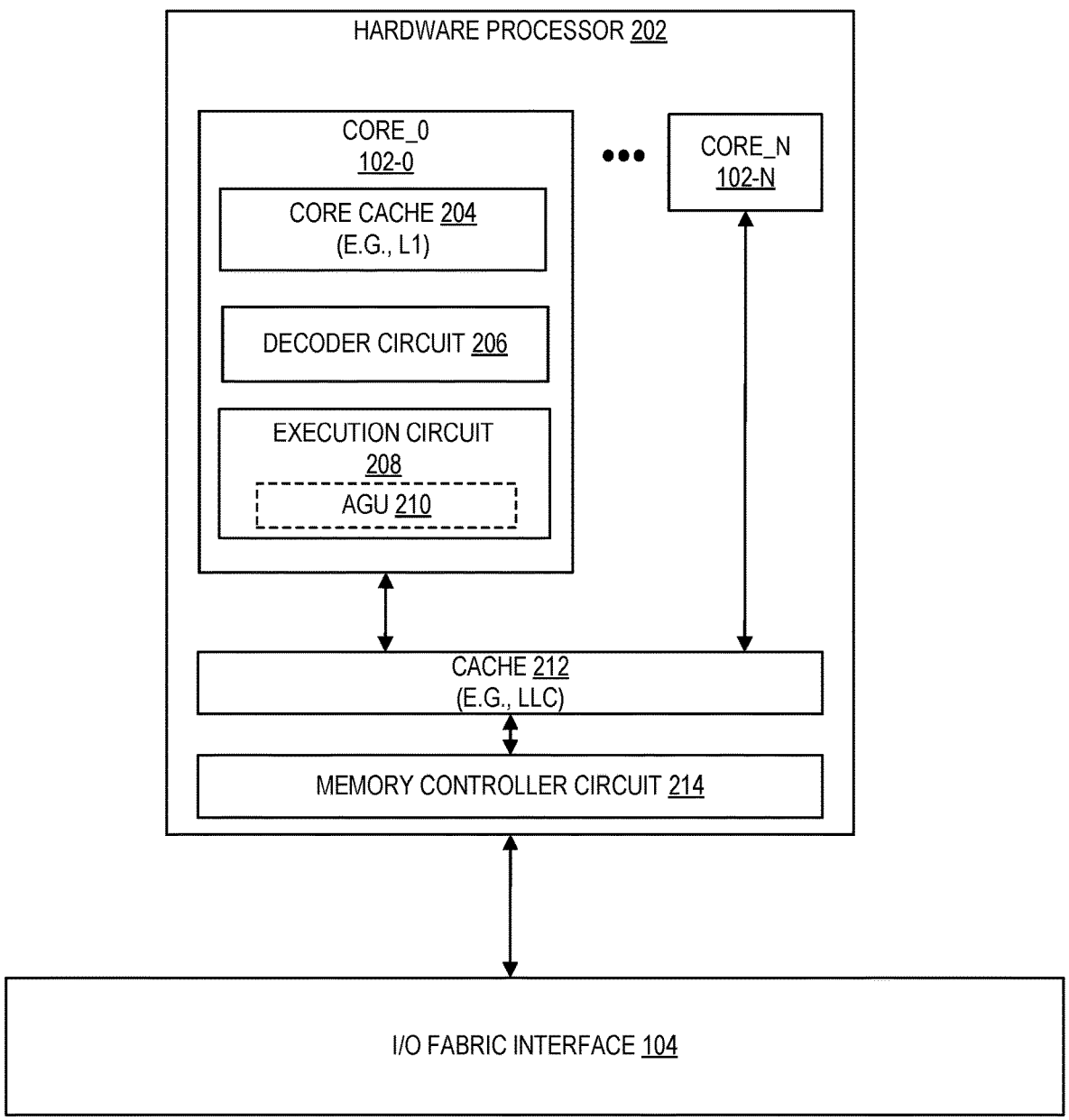
FIG. 2 illustrates a block diagram of a hardware processor including a plurality of cores according to embodiments of the disclosure.

FIG. 2 illustrates a block diagram of a hardware processor 202 including a plurality of cores 102-0 to 102-N according to embodiments of the disclosure. Memory access (e.g., store or load) request may be generated by a core, e.g., a memory access request may be generated by execution circuit 208 of core 102-0 (e.g., caused by the execution of an instruction) and/or a memory access request may be generated by execution circuit of core 102-N (e.g., by address generation unit 210 thereof) (e.g., caused by a decode by decoder circuit 206 of an instruction and the execution of the decoded instruction). In certain embodiments, a memory access request is serviced by one or more levels of cache, e.g., core (e.g., first level (L1)) cache 204 for core 102-0 and a cache 212 (e.g., last level cache (LLC)), e.g., shared by a plurality of cores. Additionally or alternatively (e.g., for a cache miss), memory access request may be serviced by memory separate from a cache, e.g., but not a disk drive.

In certain embodiments, hardware processor 202 includes a memory controller circuit 214. In one embodiment, a single memory controller circuit is utilized for a plurality of cores 102-0 to 102-N of hardware processor 202. Memory controller circuit 214 may receive an address for a memory access request, e.g., and for a store request also receiving the payload data to be stored at the address, and then perform the corresponding access into memory, e.g., via I/O fabric interface 104 (e.g., one or more memory buses). In certain embodiments, memory controller 214 includes a memory controller for volatile type of memory 108 (e.g., DRAM) and a memory controller for non-volatile type of far memory 146 (e.g., non-volatile DIMM or non-volatile DRAM). Computer system 100 may also include a coupling to secondary (e.g., external) memory (e.g., not directly accessible by a processor), for example, a disk (or solid state) drive (e.g., storage unit 1928 in FIG. 19).

As noted above, an attempt to access a memory location may indicate that the data to be accessed is not available, e.g., a page miss. Certain embodiments herein then trigger a decompressor circuit to perform a decompression operation (e.g., via a corresponding descriptor) on the compressed version of that data, e.g., to service the miss with the decompressed data within a single computer.

Figure 3:
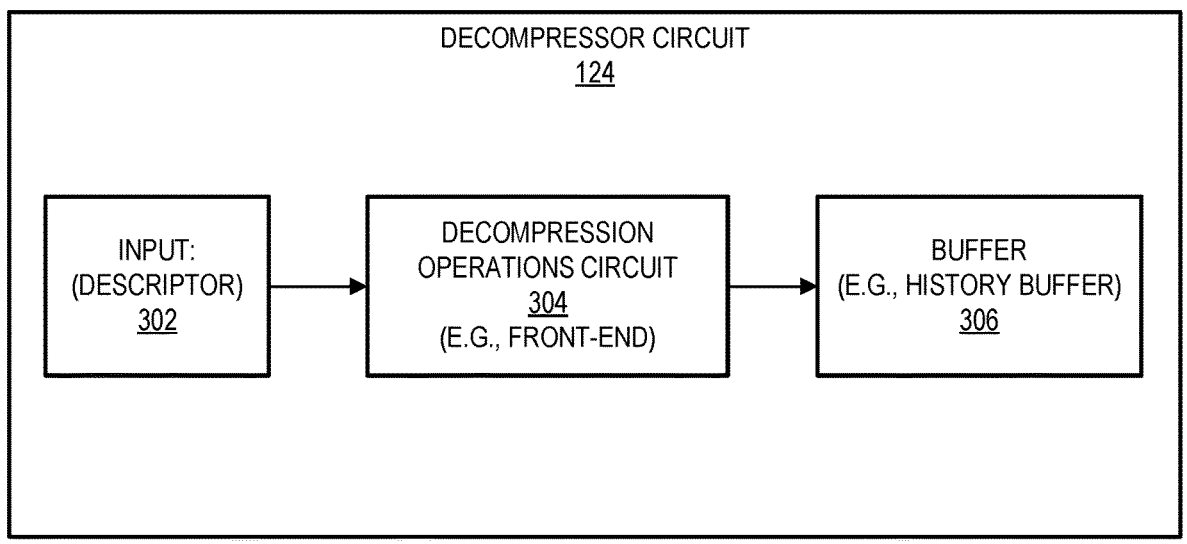
FIG. 3 is a block flow diagram of a decompressor circuit according to embodiments of the disclosure.

FIG. 3 is a block flow diagram of a decompressor circuit 124 according to embodiments of the disclosure. Decompressor circuit 124 takes as an input a descriptor 302, decompression operations circuit 304 performs decompression operations (e.g., as indicated by the descriptor) on the compressed data identified in the descriptor 302, and then stores that data within buffer 306 (e.g., history buffer). In certain embodiments, the buffer 306 is sized to store all the data from a single decompression operation.

Turning to FIGS. 1 and 3 cumulatively, as one example use, a (e.g., decompression) operation is desired (e.g., on data that missed in a core and is to be loaded from far memory 146 into uncompressed data 114 in memory 108 and/or into one or more cache levels of a core), and a corresponding descriptor is sent to accelerator 144, e.g., into a work queue 140-0 to 140-M. In certain embodiments, that descriptor is then picked up by control logic circuit 136 and sent to one of the accelerator circuits 106-0 to 106-N (e.g., engines), for example, which are mapped to different compression and decompression pipelines. In certain embodiments, the engine will start reading the source data from the source address (e.g., in compressed data 116) specified in the descriptor, and the DMA circuit 122 will send a stream of input data into the decompressor circuit 124.

Single Descriptor Mode

In a first mode (e.g., as indicated by a descriptor 302 which has a destination address specified), the DMA circuit 122 will also take the output stream from the decompressor circuit 124 and write it out to memory 108 (e.g., as uncompressed data 114).

FIG. 4 illustrates an example format of a descriptor 400 according to embodiments of the disclosure. Descriptor 400 may include any of the depicted fields, for example, with PASID being Process Address Space ID, e.g., to identify accelerator 144. In certain embodiments, operation code 402 is a value that indicates an (e.g., decompression or compression) operation where a single descriptor 400 identifies the source address and the destination address.

Dual Descriptor Mode

In a second mode (e.g., as indicated by a first descriptor 302 which does not have a destination address specified), instead of the DMA circuit 122 taking the output stream from the decompressor circuit 124 and writing it out to memory 108 (e.g., as uncompressed data 114) in response to the first descriptor, the accelerator circuit (e.g., decompressor circuit 124) that is decompressing that data is to instead store it internally (e.g., within buffer 306 as shown in FIG. 3).

Figure 5:
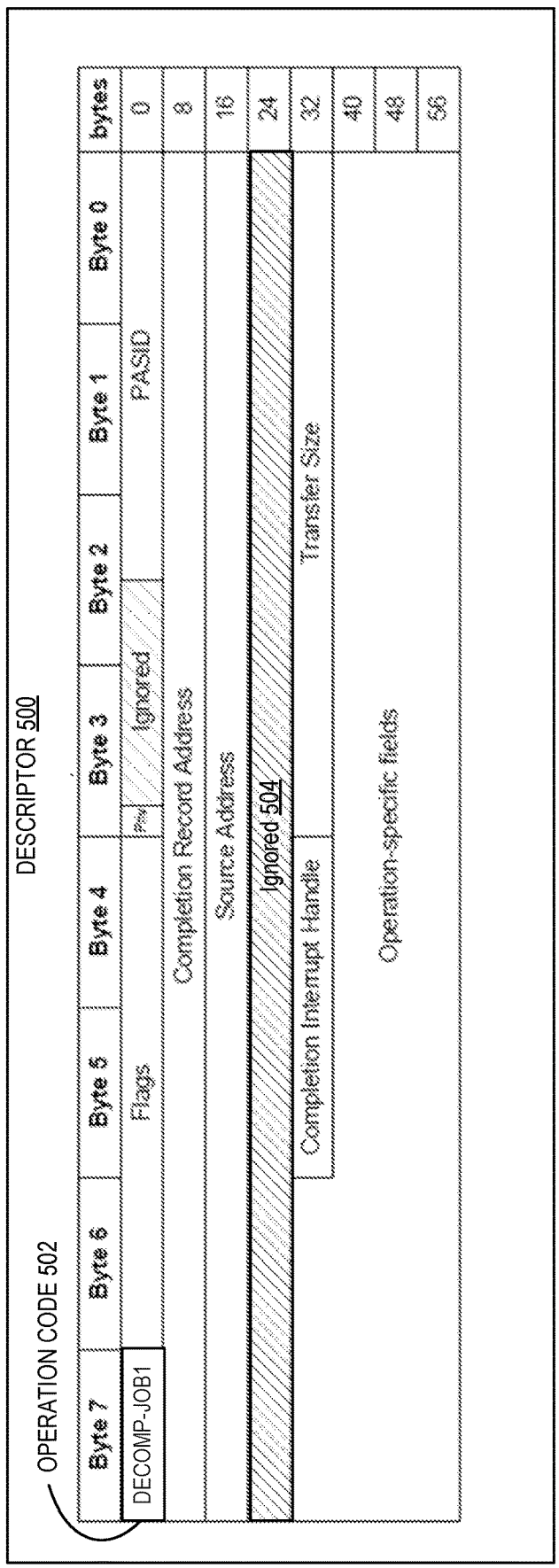
FIG. 5 illustrates an example format of a descriptor including a source address according to embodiments of the disclosure.

FIG. 5 illustrates an example format of a descriptor 500 including a source address according to embodiments of the disclosure. In certain embodiments, operation code 502 (e.g., JOB1) is a value that indicates an (e.g., decompression or compression) operation where a first descriptor 500 (of a pair of descriptors) identifies the source address but does not have a destination address specified (e.g., destination field 504 is ignored or not present), and instead of the DMA circuit 122 taking the output stream from the decompressor circuit 124 and writing it out to memory 108 (e.g., as uncompressed data 114) in response to this descriptor 500, the accelerator circuit (e.g., decompressor circuit 124) that is decompressing that data is to instead store it internally (e.g., within buffer 306 as shown in FIG. 3).

In the second mode (e.g., as indicated by a second descriptor 302 having its destination address specified and corresponding to the first descriptor which did not have its destination address specified), the DMA circuit 122 will then output the stream from the internal storage (e.g., buffer 306 as shown in FIG. 3) of decompressor circuit 124 and write it out to memory 108 (e.g., as uncompressed data 114) in response to the second descriptor.

FIG. 6 illustrates an example format of a descriptor 600 including a destination address according to embodiments of the disclosure. In certain embodiments, operation code 602 (e.g., JOB2) is a value that indicates an (e.g., decompression or compression) operation where a second descriptor 600 of a pair of descriptors for a same input data (e.g., identifying the same source address) has a destination address specified (e.g., destination field 604 is valid or present), and the DMA circuit 122 will then output the stream from the internal storage (e.g., buffer 306 as shown in FIG. 3) of decompressor circuit 124 and write it out to memory 108 (e.g., as uncompressed data 114) in response to the descriptor 600.

Thus, in certain embodiments, the first mode requires all the fields in the descriptor to be filled with accurate data before the job can be submitted to the accelerator, but the second mode allows submitting of a pair of descriptors (e.g., arbitrarily spaced apart in terms of submission time). In one embodiment, a first descriptor of a pair has a new operation code (e.g., of the form "decompress-block size-job1" (e.g., decompress-4K-job1) where the destination address field is ignored (e.g., zeroed out) and/or a second descriptor of the pair has a new operation code (e.g., of the form "decompress-block size-job2" (e.g., decompress-4K-job2) where the destination is correct/valid (e.g., the with the other fields having the same values as job1).

FIG. 7 is a flow diagram illustrating (e.g., hardware flow) operations 700 of a method of decompression according to embodiments of the disclosure. Some or all of the operations 700 (or other processes described herein, or variations, and/or combinations thereof) are performed under the control of a computer system (e.g., an accelerator thereof). The operations 700 include, at block 702, an accelerator receiving JOB1 (e.g., according to a first descriptor 500) and seeing the special operation code (e.g., operation code 502), and in response, locking an available decompressor circuit (e.g., decompression pipeline) and storing the relevant identifying information (e.g., PASID and the source address) in a new mapping table for locked decompressor circuits (e.g., decompression pipelines). The operations 700 further include, at 704, direct memory access circuit of the accelerator is setup for reading an input stream of compressed data. The operations 700 further include, at 706, decompressor circuit (e.g., pipeline) is setup to suppress generating an output stream of decompressed data. The operations 700 further include, at 708, decompression operation proceeds consuming the input stream of compressed data and generating decompressed data (for example, a maximum of a page size, e.g., 4 KB) which is written to the local history buffer memory in the decompressor circuit. The operations 700 further include, at 710, in parallel with the above, software will find an available location in memory for the decompressed data (e.g., destination free page) and submit JOB2 (e.g., according to a second descriptor 600 and including operation code 602). The operations 700 decompressor circuit (e.g., pipeline) further include, at 712, the accelerator receives JOB2 with a special opcode (e.g., operation code 602), and in response, routes this job to the locked decompressor circuit (e.g., pipeline). In certain embodiments, the accelerator sees JOB2 of the special opcode, and matches the identifying information in the mapping table to route this job to the locked decompressor circuit (e.g., pipeline) (e.g., where in the meantime no other job can be sent to that decompressor circuit (e.g., pipeline)). The operations 700 further include, at 714, the locked decompressor circuit (e.g., pipeline) enters into a special "dump-state" mode, and empties the local history buffer memory (e.g., at high speed) into the output stream, and the DMA circuit is setup to transfer the decompressed data to the memory using the specified destination address of the available location. The operations 700 further include, at 716, completion (e.g., interrupt) is signaled. The operations 700 further include, at 718, the decompressor circuit (e.g., pipeline) is unlocked (e.g., and mapping table cleared).

Figure 8:
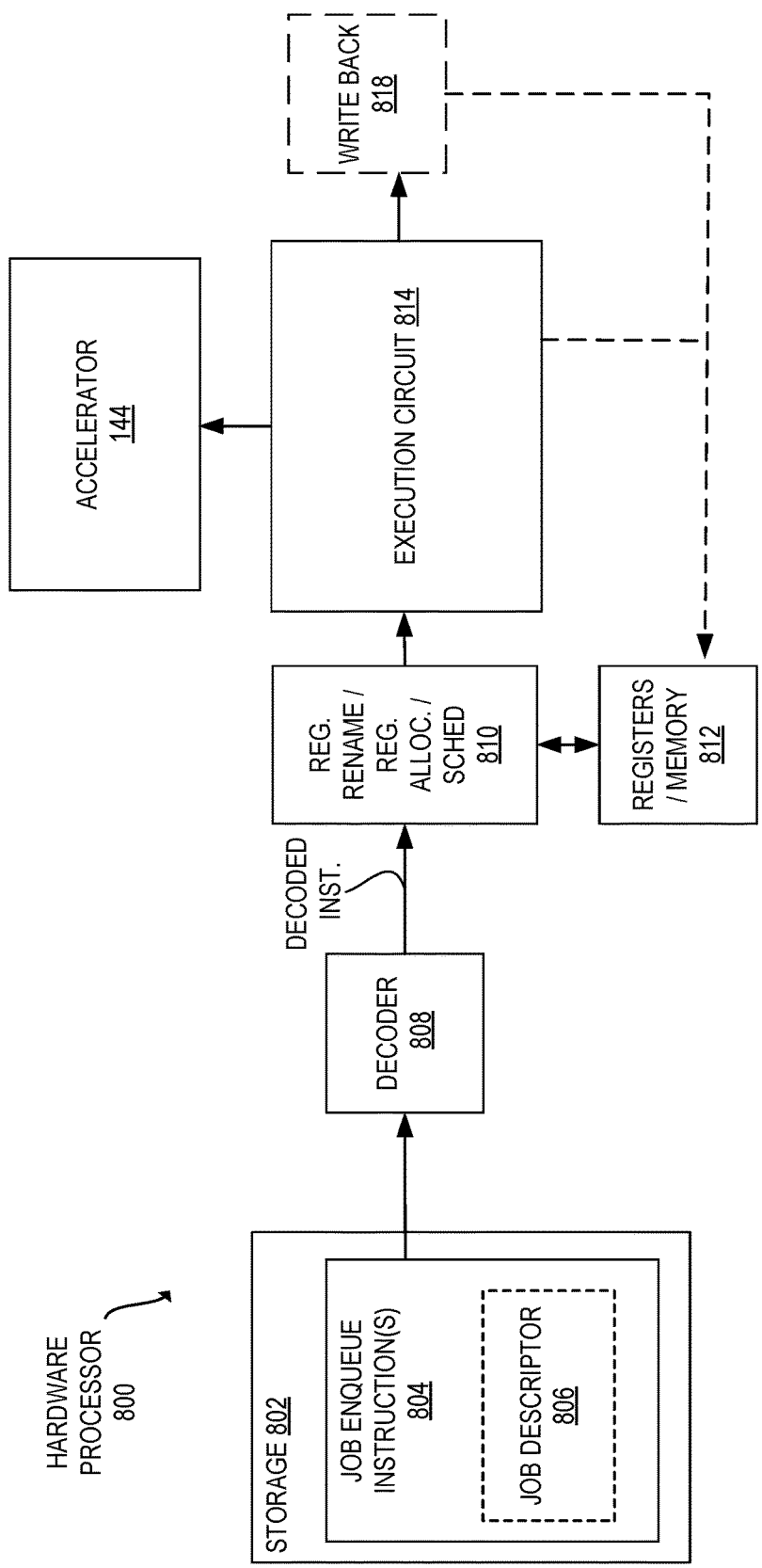
FIG. 8 illustrates a hardware processor coupled to storage that includes one or more job enqueue instructions according to embodiments of the disclosure.

FIG. 8 illustrates a hardware processor 800 coupled to storage 802 that includes one or more job enqueue instructions 804 according to embodiments of the disclosure. In certain embodiments, job enqueue instruction is according to any of the disclosure herein. In certain embodiments, job enqueue instruction 804 identifies a job descriptor 806 (e.g., and the (e.g., logical) MMIO address of an accelerator.

In one embodiment, e.g., in response to a request to perform an operation, the instruction (e.g., macro-instruction) is fetched from storage 802 and sent to decoder 808. In the depicted embodiment, the decoder 808 (e.g., decoder circuit) decodes the instruction into a decoded instruction (e.g., one or more micro-instructions or micro-operations). The decoded instruction is then sent for execution, e.g., via scheduler circuit 810 to schedule the decoded instruction for execution.

In certain embodiments, (e.g., where the processor/core supports out-of-order (OoO) execution), the processor includes a register rename/allocator circuit 810 coupled to register file/memory circuit 812 (e.g., unit) to allocate resources and perform register renaming on registers (e.g., registers associated with the initial sources and final destination of the instruction). In certain embodiments, (e.g., for out-of-order execution), the processor includes one or more scheduler circuits 810 coupled to the decoder 808. The scheduler circuit(s) may schedule one or more operations associated with decoded instructions, including one or more operations decoded from a job enqueue instruction 804, e.g., for offloading execution of an operation to accelerator 144 by the execution circuit 814.

In certain embodiments, a write back circuit 818 is included to write back results of an instruction to a destination (e.g., write them to a register(s) and/or memory), for example, so those results are visible within a processor (e.g., visible outside of the execution circuit that produced those results).

One or more of these components (e.g., decoder 808, register rename/register allocator/scheduler 810, execution circuit 814, registers (e.g., register file)/memory 812, or write back circuit 818) may be in a single core of a hardware processor (e.g., and multiple cores each with an instance of these components).

Figure 9:
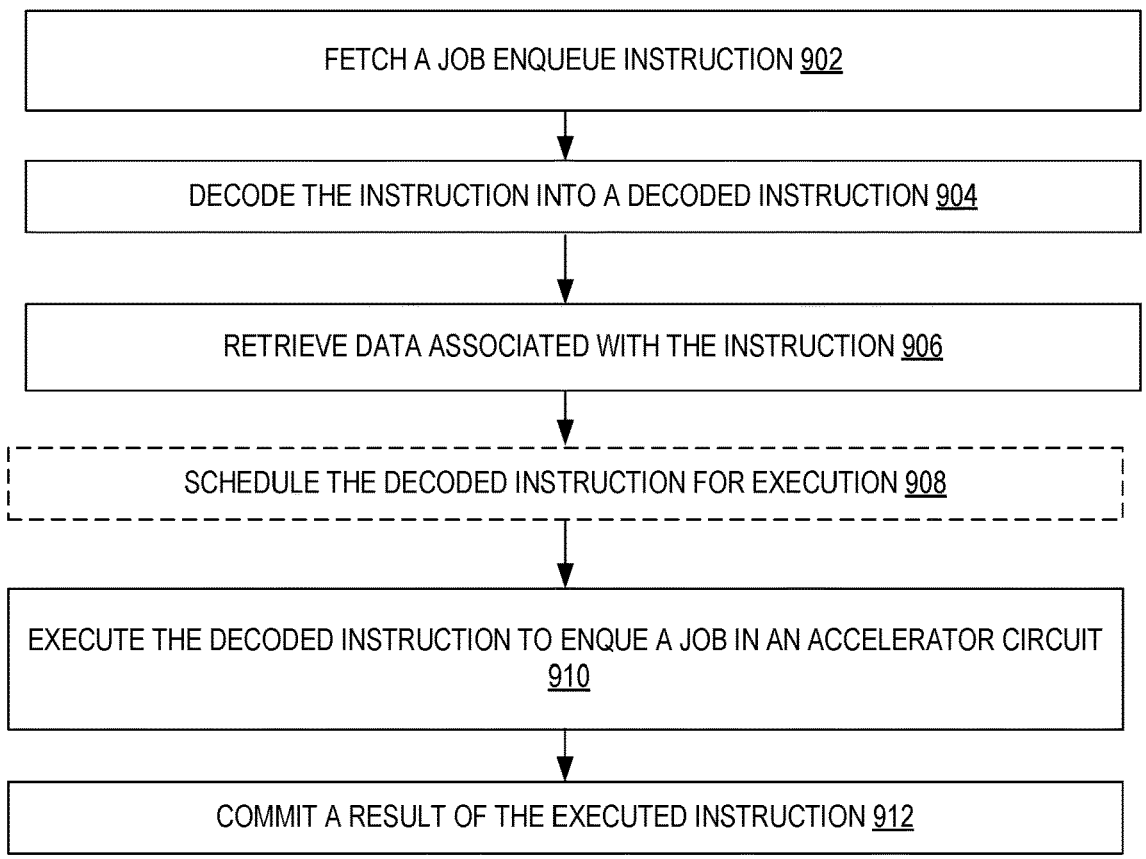
FIG. 9 is a flow diagram illustrating operations of a method for processing a job enqueue instruction according to embodiments of the disclosure.

FIG. 9 is a flow diagram illustrating operations 900 of a method for processing a job enqueue instruction according to embodiments of the disclosure. A processor (e.g., or processor core) may perform operations 900 of method, e.g., in response to receiving a request to execute an instruction from software. Depicted operations 900 includes processing a "job enqueue" instruction by performing a: fetch of an instruction (e.g., having an instruction opcode corresponding to the job enqueue mnemonic) 902, decode of the instruction into a decoded instruction 904, retrieve data associated with the instruction 906, (optionally) schedule the decoded instruction for execution 908, execute the decoded instruction to enqueue a job in an accelerator circuit 910, and commit a result of the executed instruction 912.

FIG. 10 is a flow diagram illustrating operations 1000 of a method of decompression according to embodiments of the disclosure. Some or all of the operations 1000 (or other processes described herein, or variations, and/or combinations thereof) are performed under the control of a computer system (e.g., an accelerator thereof). The operations 1000 include, at block 1002, sending, by a hardware processor core of a system, a first descriptor to an accelerator circuit coupled to the hardware processor core and having a decompressor circuit and a direct memory access circuit. The operations 1000 further include, at block 1004, in response to receiving the first descriptor, decompressing compressed data from the direct memory access circuit into decompressed data by the decompressor circuit and storing the decompressed data in a buffer in the accelerator circuit. The operations 1000 include, at block 1006, sending, by the hardware processor core of the system, a second descriptor to the accelerator circuit separately from the first descriptor. The operations 1000 include, at block 1008, in response to receiving the second descriptor, writing the decompressed data from the buffer to memory external to the accelerator circuit by the direct memory access circuit.

Embodiments herein can thus save the time it takes for an OS to find an available location in memory for the decompressed data (e.g., destination free page). Certain embodiments herein allow a dump of memory state (e.g., in response to JOB2 descriptor) to be overlapped with the final stage of the decompression operation itself, for example, assume the second job is received when the decompressor has generated a proper subset of the entire block (e.g., 3 KB of a 4 KB page) of decompressed data, the accelerator can enter a mode where it now processes both jobs, e.g., JOB1 continues filling the last of the decompressed data (e.g., 1 KB) into the local history buffer memory, while JOB2 drains it from the start ensuring it does not overrun the last written location in the local history buffer memory for JOB1.

Further Extensions to a Hardware Scheme

Certain embodiments herein can be extended to handle blocks of data (e.g., pages) larger than the local history buffer memory (e.g., buffer 306 in FIG. 3), for example, to handle pages larger than 4 KB (or 4 KiB) even with an accelerator whose internal memory is smaller than 4 KB (or 2 KiB). For example, to optimize the processing of a (e.g., 2 MB or 2 MiB) page, while the accelerator history buffer is much smaller (e.g., 4 KB or 4 KiB). In certain embodiments, the accelerator can switch between two modes:

(1) Descriptor 1 (Desc-1) mode which will read in data and decompress to internal memory until it fills up local history buffer memory (e.g., buffer 306 in FIG. 3) (e.g., 4 KB), and at this point, the pipeline is stalled and will not consume any more input data, but awaits the second descriptor Desc-2.

(2) Descriptor (Desc-2) mode such that when Desc-2 arrives to this accelerator (e.g., pipeline) providing the destination address, the decompressor circuit (or engine) responds by dumping data (e.g., "state") to the output stream (e.g., and the DMA circuit writes to the destination), and then reverts to processing the decompression operation by reading in more input data and continuously producing output data.

In certain embodiments when decompressing data whose decompressed output will be greater than a (e.g., internal to the accelerator) local buffer size (e.g., buffer 306 in FIG. 3), a first job (JOB1) (e.g., a corresponding descriptor) does not complete, e.g., it stalls when the (e.g., internal to the accelerator) local buffer is full. However, in certain of these embodiments, the accelerator tracks that it has processed a certain proper subset of data (e.g., "S" number of bytes) from the input stream, and the accelerator (e.g., decompressor circuit) stays locked until a second job (JOB2) (e.g., a corresponding descriptor) of that pair of jobs is received (e.g., where the JOB2 descriptor has the same source address as JOB1 or the accelerator stores that source address info from JOB1 along with an indication of the certain proper subset of already processed data (e.g., "S" number of bytes)). In certain embodiments, when the second job (JOB2) (e.g., a corresponding descriptor) of that pair of jobs is received, the accelerator knows the first job (JOB1) was stalled, so the accelerator (e.g., decompressor circuit) then dumps the decompressed data from the (e.g., internal to the accelerator) local buffer to the output stream (e.g., for storage in DRAM), and then resumes the stalled decompress operation starting after skipping that compressed version of the proper subset of data (e.g., "S" number of bytes) from the input stream.

Compression

Although the above discusses decompression, it should be understood that embodiments herein may be utilized with compression. In certain embodiments, when it is desired to compress data, the OS needs to know the size of the compressed data to get maximum benefit from the compression ratio (e.g., to avoid unduly limiting the compression ratio). In one embodiment, an OS compresses data to a temporary buffer and then moves the compressed data to the compressed memory (e.g., compressed data 116 in FIG. 1) based on its size. However, that causes cache pollution and wastes memory bandwidth and processor (e.g., CPU) cycles in certain embodiments.

Embodiments herein overcome these issues by a compression where:

(1) OS submits first descriptor without destination address for the compressed data.

(2) OS reads first completion record to find size of compressed data. E.g., where in this flow, desc-1 and desc-2 have different completion record addresses since it is desired for both jobs to convey some information back.

(3) OS determines destination address in compressed memory pool based on the size from the first job and submits a second descriptor to write the data to the destination address. In some embodiments, a buffer within compressor circuit (e.g., compressor circuit 128 in FIG. 1) is utilized to store the compressed data and/or the compressed stream at one time.

Local Shared Memory

In certain embodiments, a local shared memory (e.g., local memory 148 in FIG. 1) is used to temporarily store the entire compression and/or decompression results for several jobs. For example, for a large local memory shared across all pipelines in the instance. These regions can be addressed by descriptors using a special flag (e.g., not DRAM/system memory, but a region in local device).

In certain embodiments, a first descriptor causes an accelerator circuit to write compression and/or decompression output to the local memory 148, and a second descriptor moves data from the local memory 148 to the destination address, for example, in LLC of core(s) (e.g., LLC as cache 212 in FIG. 2) for decompression or DRAM (e.g., Double Data Rate Synchronous Dynamic Random-Access Memory (DDR SDRAM))) for compression. Thus, in certain embodiments, the compressor and/or decompressor circuits would (e.g., only) be blocked when the local memory 148 is full. For example, where the OS could throw away compression results that are too big (e.g., without using any bandwidth to write the data to DRAM) by sending a second descriptor to drop a job's data from the local memory 148. In certain embodiments, there is an operation to allocate/free memory regions in this device memory, but freeing of buffers can also implicitly happen with certain operations that read out the results.

System Software Modifications

Embodiments herein define a scheme to achieve similar results without changes to an accelerator itself, e.g., but with some changes to system software.

Figure 11:
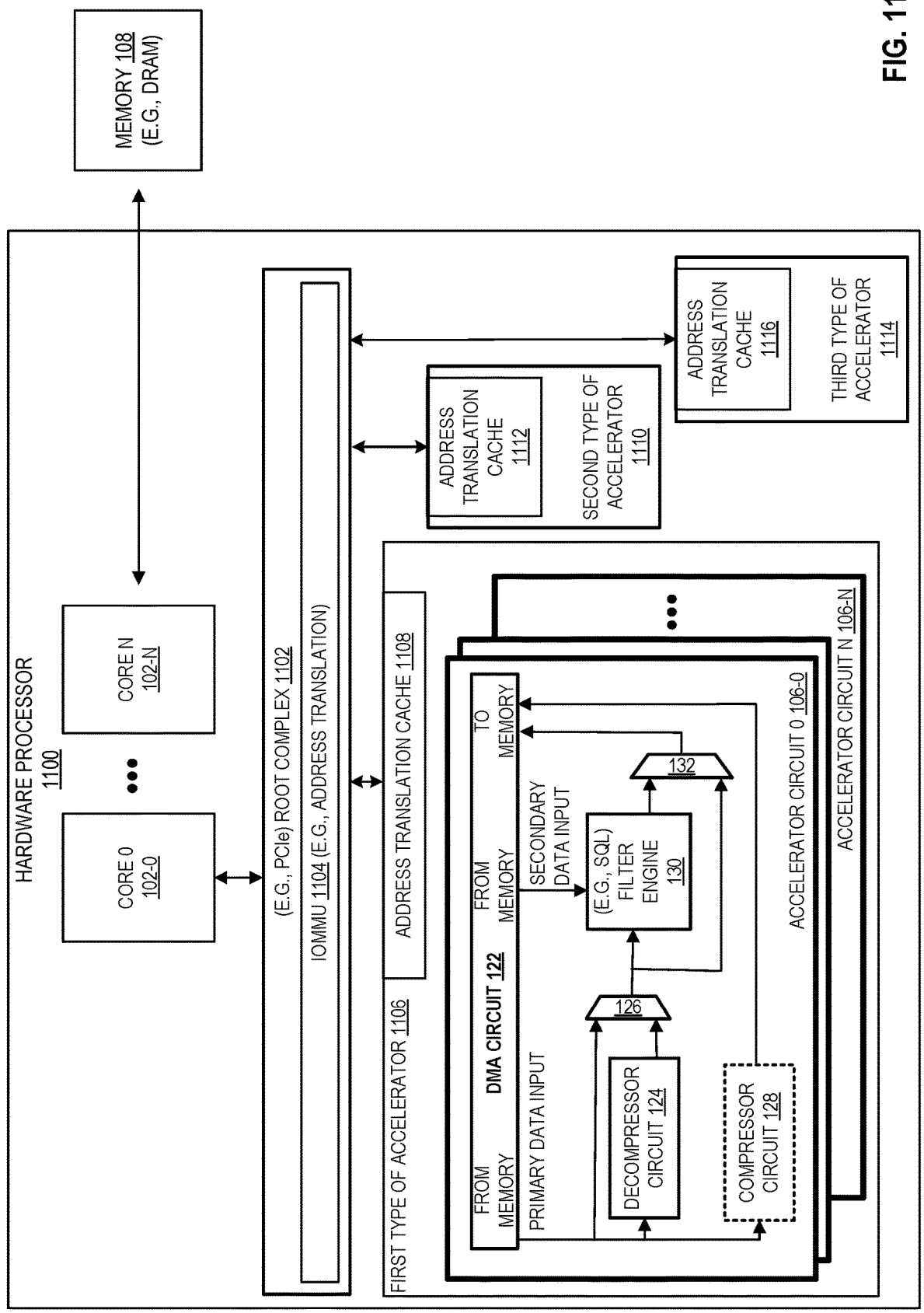
FIG. 11 illustrates a block diagram of a hardware processor including a plurality of accelerators and an input/output memory management unit (IOMMU) according to embodiments of the disclosure.

FIG. 11 illustrates a block diagram of a hardware processor 1100 including a plurality of accelerators 1106, 1110, and 114 and an input/output memory management unit (IOMMU) 1104 according to embodiments of the disclosure. Hardware processor 1100 may include one or more cores 102-0 to 102-N, e.g., coupled to memory 108. In certain embodiments, (e.g., PCIe) root complex 1102 has an IOMMU 1104 that allow for address translation, for example, from a virtual address to a physical address. One or more of accelerators 1106, 1110, and 114 may include their own address translation cache (ATC) 1108, 1112, and 1116, respectively, may be included, e.g., as a TLB to translate a virtual (e.g., source or destination) address to a physical address (e.g., in memory 108 and/or far memory 146).

In certain embodiments, an accelerator (e.g., accelerators 1106, 1110, and/or 114) has a mode for support of shared virtual memory, whereby virtual addresses are specified in the descriptor, and the hardware translates these into physical addresses using address translation services of the IOMMU 1104. In certain embodiments, an accelerator (e.g., accelerators 1106, 1110, and/or 114) has a mode that allows a job to block-on-fault, e.g., to wait for a page fault to be resolved by the OS.

Certain embodiments herein are directed to a scheme for an OS to speculatively decompress data. For example, with an OS using a new unmapped virtual address V as the destination address in the job descriptor for an accelerator such that it configures the accelerator to block-on-fault. Thus, in certain embodiments, when the accelerator tries to write its output to this address, the page-walk logic will not find the page present causing a fault to the OS (e.g., from the IOMMU 1104). The OS may then map the address V to a new free page, and resume operation of the accelerator, e.g., and when the accelerator is done, the OS maps the application's missing page to this new page.

In certain embodiments, to save the optimal amount of latency, this is combined with a new opcode for an accelerator that does not stream out its output as it reads in its input stream. For example, it may write output into the local history buffer memory, and dump that state out at the very end. In certain embodiments, DMA circuit of an accelerator is also notified that for this special opcode, it should not attempt to prefetch translations on the destination address but do it lazily after some amount of data is available in the write-buffers (e.g., first 512 bytes). This gives a chance for the OS to fix the mapping before the accelerator can request the address translation services (ATS).

First type of accelerator 1106 may be accelerator 144 from FIG. 1, e.g., an In-Memory Analytics accelerator (IAX). Second type of accelerator 1110 may support a set of transformation operations on memory, e.g., a data streaming accelerator (DSA). For example, to generate and test cyclic redundancy check (CRC) checksum or Data Integrity Field (DIF) to support storage and networking applications and/or for memory compare and delta generate/merge to support VM migration, VM Fast check-pointing, and software managed memory deduplication usages. Third type of accelerator 1114 may support security, authentication, and compression operations (e.g., cryptographic acceleration and compression operations), e.g., a QuickAssist Technology (QAT) accelerator.

Exemplary architectures, systems, etc. that the above may be used in are detailed below. Exemplary instruction formats that may cause enqueuing of a job for an accelerator are detailed below.

At least some embodiments of the disclosed technologies can be described in view of the following examples:

Example 1. An apparatus comprising:
a hardware processor core; and
an accelerator circuit coupled to the hardware processor core, the accelerator circuit comprising a decompressor circuit and a direct memory access circuit to:
in response to a first descriptor sent from the hardware processor core, cause the decompressor circuit to decompress compressed data from the direct memory access circuit into decompressed data and store the decompressed data in a buffer in the accelerator circuit, and
in response to a second descriptor sent from the hardware processor core separately from the first descriptor, cause the decompressed data to be written from the buffer to memory external to the accelerator circuit by the direct memory access circuit.

Example 2. The apparatus of example 1, wherein the accelerator circuit is to write the decompressed data to a destination address in the memory specified by the second descriptor and not the first descriptor.

Example 3. The apparatus of example 2, wherein the second descriptor comprises at least one value that indicates the second descriptor provides the destination address for the decompressed data generated in response to the first descriptor.

Example 4. The apparatus of example 3, wherein the at least one value is a same source address of the compressed data in the first descriptor and the second descriptor.

Example 5. The apparatus of example 1, wherein the accelerator circuit is to:
in response to the first descriptor sent from the hardware processor core, cause the decompressor circuit to stall decompression of the compressed data when the buffer in the accelerator circuit reaches a full threshold of the decompressed data from the decompression; and
in response to the second descriptor sent from the hardware processor core separately from the first descriptor, cause the decompressed data to be written from the buffer to the memory external to the accelerator circuit by the direct memory access circuit, and resume decompression of the compressed data.

Example 6. The apparatus of example 1, further comprising a second accelerator circuit comprising a second decompressor circuit and a second direct memory access circuit, wherein the accelerator circuit is to, in response to the first descriptor, lock the decompressor circuit from decompressing other compressed data.

Example 7. The apparatus of example 6, wherein the accelerator circuit is to, in response to the second descriptor, unlock the decompressor circuit from decompressing other compressed data after completion of decompression of the compressed data.

Example 8. The apparatus of example 1, wherein the hardware processor core comprises:
a decoder circuit to decode a first instruction comprising a first opcode into a decoded first instruction and decode a second instruction comprising a second opcode into a decoded second instruction, the first opcode to indicate an execution circuit is to generate the first descriptor and cause the first descriptor to be sent to the accelerator circuit, and the second opcode to indicate the execution circuit is to generate the second descriptor and cause the second descriptor to be sent to the accelerator circuit, and
the execution circuit to execute the decoded first instruction according to the first opcode to generate the first descriptor and cause the first descriptor to be sent to the accelerator circuit, and execute the decoded second instruction according to the second opcode to generate the second descriptor and cause the second descriptor to be sent to the accelerator circuit.

Example 9. A method comprising:
sending, by a hardware processor core of a system, a first descriptor to an accelerator circuit coupled to the hardware processor core and having a decompressor circuit and a direct memory access circuit;
in response to receiving the first descriptor, decompressing compressed data from the direct memory access circuit into decompressed data by the decompressor circuit and storing the decompressed data in a buffer in the accelerator circuit;

sending, by the hardware processor core of the system, a second descriptor to the accelerator circuit separately from the first descriptor; and in response to receiving the second descriptor, writing the decompressed data from the buffer to memory external to the accelerator circuit by the direct memory access circuit.

Example 10. The method of example 9, where the writing of the decompressed data is to a destination address in the memory specified by the second descriptor and not the first descriptor.

Example 11. The method of example 10, wherein the sending the second descriptor comprises sending at least one value indicating the second descriptor provides the destination address for the decompressed data generated in response to the first descriptor.

Example 12. The method of example 11, wherein the at least one value is a same source address of the compressed data in the first descriptor and the second descriptor.

Example 13. The method of example 9, further comprising:

in response to receiving the first descriptor, stalling the decompressing of the compressed data by the decompressor circuit when the buffer in the accelerator circuit reaches a full threshold of the decompressed data from the decompressing; and in response to receiving the second descriptor, writing the decompressed data from the buffer to the memory external to the accelerator circuit by the direct memory access circuit, and resuming the decompressing of the compressed data.

Example 14. The method of example 9, wherein the system further comprises a second accelerator circuit comprising a second decompressor circuit and a second direct memory access circuit, and further comprising, in response to receiving the first descriptor, locking the decompressor circuit from decompressing other compressed data.

Example 15. The method of example 14, further comprising, in response to receiving the second descriptor, unlocking the decompressor circuit from decompressing other compressed data after completion of the decompressing of the compressed data.

Example 16. The method of example 9, further comprising:

decoding, by a decoder circuit of the hardware processor core, a first instruction comprising a first opcode into a decoded first instruction and a second instruction comprising a second opcode into a decoded second instruction, the first opcode to indicate an execution circuit is to generate the first descriptor and cause the first descriptor to be sent to the accelerator circuit, and the second opcode to indicate the execution circuit is to generate the second descriptor and cause the second descriptor to be sent to the accelerator circuit, and executing, by the execution circuit of the hardware processor core, the decoded first instruction according to the first opcode to generate the first descriptor and cause the sending of the first descriptor to the accelerator circuit, and the decoded second instruction according to the second opcode to generate the second descriptor and cause the sending of the second descriptor to the accelerator circuit.

Example 17. An apparatus comprising:
a hardware processor core;
a memory; and
an accelerator circuit coupled to the hardware processor core and the memory, the accelerator circuit comprising a decompressor circuit and a direct memory access circuit to:

in response to a first descriptor sent from the hardware processor core, cause the decompressor circuit to decompress compressed data from the memory into decompressed data and store the decompressed data in a buffer in the accelerator circuit, and in response to a second descriptor sent from the hardware processor core separately from the first descriptor, cause the decompressed data to be written from the buffer to the memory by the direct memory access circuit.

Example 18. The apparatus of example 17, wherein the accelerator circuit is to write the decompressed data to a destination address in the memory specified by the second descriptor and not the first descriptor.

Example 19. The apparatus of example 18, wherein the second descriptor comprises at least one value that indicates the second descriptor provides the destination address for the decompressed data generated in response to the first descriptor.

Example 20. The apparatus of example 19, wherein the at least one value is a same source address of the compressed data in the first descriptor and the second descriptor.

Example 21. The apparatus of example 17, wherein the accelerator circuit is to:

in response to the first descriptor sent from the hardware processor core, cause the decompressor circuit to stall decompression of the compressed data when the buffer in the accelerator circuit reaches a full threshold of the decompressed data from the decompression; and in response to the second descriptor sent from the hardware processor core separately from the first descriptor, cause the decompressed data to be written from the buffer to the memory external to the accelerator circuit by the direct memory access circuit, and resume decompression of the compressed data.

Example 22. The apparatus of example 17, further comprising a second accelerator circuit comprising a second decompressor circuit and a second direct memory access circuit, wherein the accelerator circuit is to, in response to the first descriptor, lock the decompressor circuit from decompressing other compressed data.

Example 23. The apparatus of example 22, wherein the accelerator circuit is to, in response to the second descriptor, unlock the decompressor circuit from decompressing other compressed data after completion of decompression of the compressed data.

Example 24. The apparatus of example 17, wherein the hardware processor core comprises:

a decoder circuit to decode a first instruction comprising a first opcode into a decoded first instruction and decode a second instruction comprising a second opcode into a decoded second instruction, the first opcode to indicate an execution circuit is to generate the first descriptor and cause the first descriptor to be sent to the accelerator circuit, and the second opcode to indicate the execution circuit is to generate the second descriptor and cause the second descriptor to be sent to the accelerator circuit, and the execution circuit to execute the decoded first instruction according to the first opcode to generate the first descriptor and cause the first descriptor to be sent to the accelerator circuit, and execute the decoded second instruction according to the second opcode to generate the second descriptor and cause the second descriptor to be sent to the accelerator circuit.

In yet another embodiment, an apparatus comprises a data storage device that stores code that when executed by a hardware processor causes the hardware processor to perform any method disclosed herein. An apparatus may be as described in the detailed description. A method may be as described in the detailed description.

An instruction set may include one or more instruction formats. A given instruction format may define various fields (e.g., number of bits, location of bits) to specify, among other things, the operation to be performed (e.g., opcode) and the operand(s) on which that operation is to be performed and/or other data field(s) (e.g., mask). Some instruction formats are further broken down though the definition of instruction templates (or subformats). For example, the instruction templates of a given instruction format may be defined to have different subsets of the instruction format's fields (the included fields are typically in the same order, but at least some have different bit positions because there are less fields included) and/or defined to have a given field interpreted differently. Thus, each instruction of an ISA is expressed using a given instruction format (and, if defined, in a given one of the instruction templates of that instruction format) and includes fields for specifying the operation and the operands. For example, an exemplary ADD instruction has a specific opcode and an instruction format that includes an opcode field to specify that opcode and operand fields to select operands (source1/destination and source2); and an occurrence of this ADD instruction in an instruction stream will have specific contents in the operand fields that select specific operands. A set of SIMD extensions referred to as the Advanced Vector Extensions (AVX) (AVX1 and AVX2) and using the Vector Extensions (VEX) coding scheme has been released and/or published (e.g., see Intel® 64 and IA-32 Architectures Software Developer's Manual, November 2018; and see Intel® Architecture Instruction Set Extensions Programming Reference, October 2018).

Exemplary Instruction Formats

Embodiments of the instruction(s) described herein may be embodied in different formats. Additionally, exemplary systems, architectures, and pipelines are detailed below. Embodiments of the instruction(s) may be executed on such systems, architectures, and pipelines, but are not limited to those detailed.

Generic Vector Friendly Instruction Format

A vector friendly instruction format is an instruction format that is suited for vector instructions (e.g., there are certain fields specific to vector operations). While embodiments are described in which both vector and scalar operations are supported through the vector friendly instruction format, alternative embodiments use only vector operations the vector friendly instruction format.

Figure 12A:
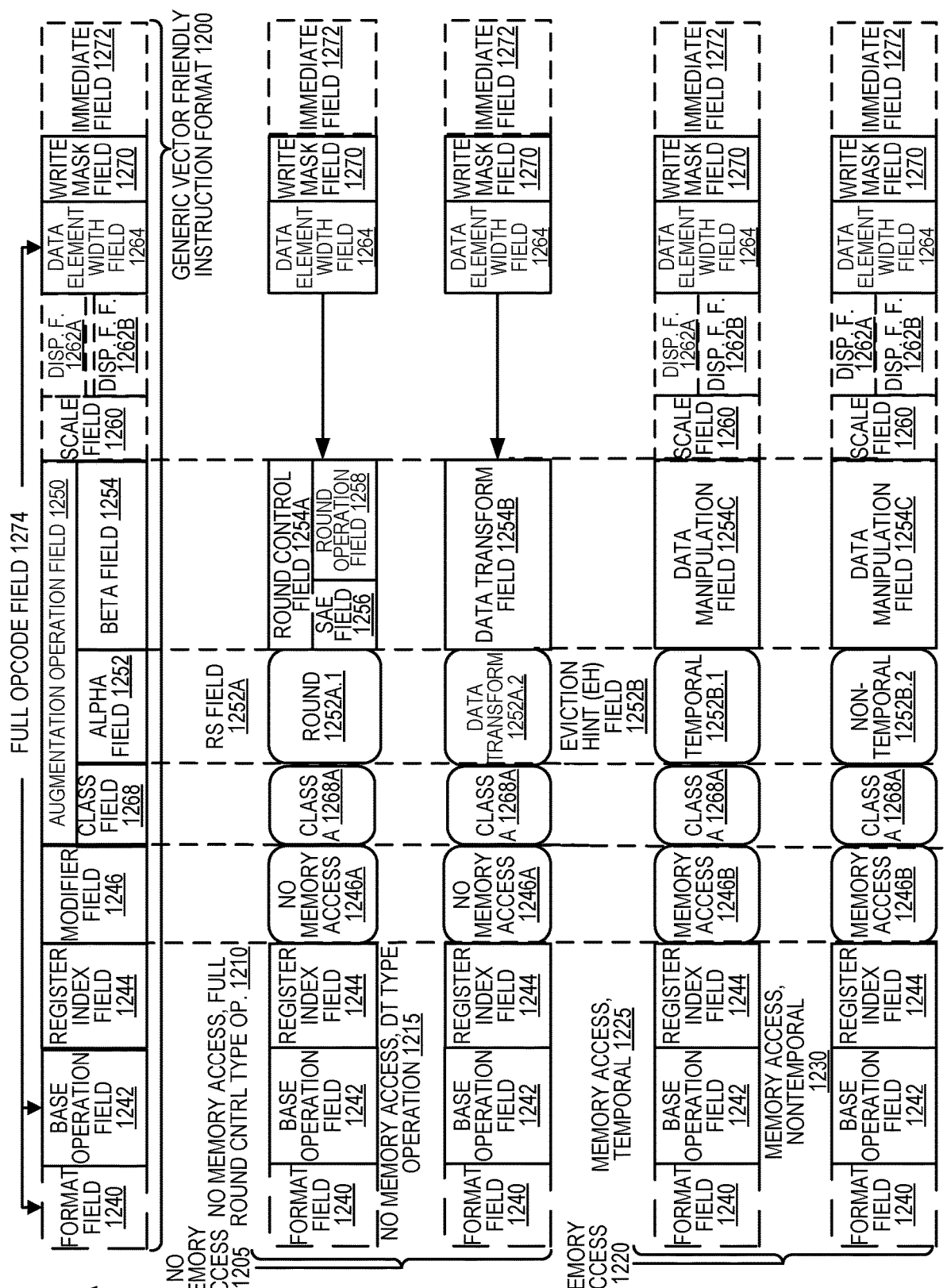
FIG. 12A is a block diagram illustrating a generic vector friendly instruction format and class A instruction templates thereof according to embodiments of the disclosure.
Figure 12B:
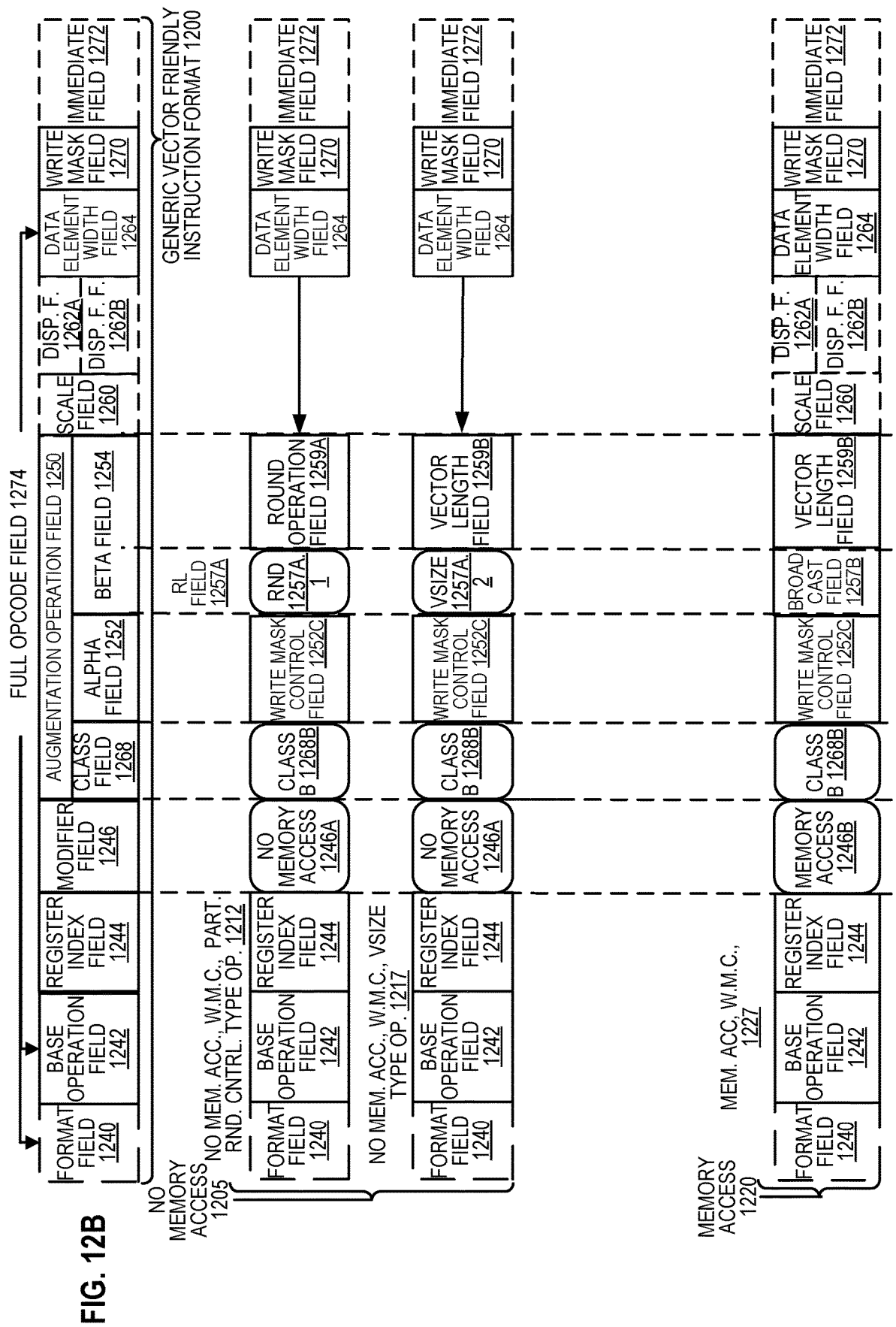
FIG. 12B is a block diagram illustrating the generic vector friendly instruction format and class B instruction templates thereof according to embodiments of the disclosure.

FIGS. 12A-12B are block diagrams illustrating a generic vector friendly instruction format and instruction templates thereof according to embodiments of the disclosure. FIG. 12A is a block diagram illustrating a generic vector friendly instruction format and class A instruction templates thereof according to embodiments of the disclosure; while FIG. 12B is a block diagram illustrating the generic vector friendly instruction format and class B instruction templates thereof according to embodiments of the disclosure. Specifically, a generic vector friendly instruction format 1200 for which are defined class A and class B instruction templates, both of which include no memory access 1205 instruction templates and memory access 1220 instruction templates. The term generic in the context of the vector friendly instruction format refers to the instruction format not being tied to any specific instruction set.

While embodiments of the disclosure will be described in which the vector friendly instruction format supports the following: a 64 byte vector operand length (or size) with 32 bit (4 byte) or 64 bit (8 byte) data element widths (or sizes) (and thus, a 64 byte vector consists of either 16 doubleword-size elements or alternatively, 8 quadword-size elements); a 64 byte vector operand length (or size) with 16 bit (2 byte) or 8 bit (1 byte) data element widths (or sizes); a 32 byte vector operand length (or size) with 32 bit (4 byte), 64 bit (8 byte), 16 bit (2 byte), or 8 bit (1 byte) data element widths (or sizes); and a 16 byte vector operand length (or size) with 32 bit (4 byte), 64 bit (8 byte), 16 bit (2 byte), or 8 bit (1 byte) data element widths (or sizes); alternative embodiments may support more, less and/or different vector operand sizes (e.g., 256 byte vector operands) with more, less, or different data element widths (e.g., 128 bit (16 byte) data element widths).

The class A instruction templates in FIG. 12A include: 1) within the no memory access 1205 instruction templates there is shown a no memory access, full round control type operation 1210 instruction template and a no memory access, data transform type operation 1215 instruction template; and 2) within the memory access 1220 instruction templates there is shown a memory access, temporal 1225 instruction template and a memory access, non-temporal 1230 instruction template. The class B instruction templates in FIG. 12B include: 1) within the no memory access 1205 instruction templates there is shown a no memory access, write mask control, partial round control type operation 1212 instruction template and a no memory access, write mask control, vsize type operation 1217 instruction template; and 2) within the memory access 1220 instruction templates there is shown a memory access, write mask control 1227 instruction template.

The generic vector friendly instruction format 1200 includes the following fields listed below in the order illustrated in FIGS. 12A-12B.

Format field 1240—a specific value (an instruction format identifier value) in this field uniquely identifies the vector friendly instruction format, and thus occurrences of instructions in the vector friendly instruction format in instruction streams. As such, this field is optional in the sense that it is not needed for an instruction set that has only the generic vector friendly instruction format.

Base operation field 1242—its content distinguishes different base operations.

Register index field 1244—its content, directly or through address generation, specifies the locations of the source and destination operands, be they in registers or in memory. These include a sufficient number of bits to select N registers from a PxQ (e.g. 32×512, 16×128, 32×1024, 64×1024) register file. While in one embodiment N may be up to three sources and one destination register, alternative embodiments may support more or less sources and destination registers (e.g., may support up to two sources where one of these sources also acts as the destination, may support up to three sources where one of these sources also acts as the destination, may support up to two sources and one destination).

Modifier field 1246—its content distinguishes occurrences of instructions in the generic vector instruction format that specify memory access from those that do not; that is, between no memory access 1205 instruction templates and memory access 1220 instruction templates. Memory access operations read and/or write to the memory hierarchy (in some cases specifying the source and/or destination addresses using values in registers), while non-memory access operations do not (e.g., the source and destinations are registers). While in one embodiment this field also selects between three different ways to perform memory address calculations, alternative embodiments may support more, less, or different ways to perform memory address calculations.

Augmentation operation field 1250—its content distinguishes which one of a variety of different operations to be performed in addition to the base operation. This field is context specific. In one embodiment of the disclosure, this field is divided into a class field 1268, an alpha field 1252, and a beta field 1254. The augmentation operation field 1250 allows common groups of operations to be performed in a single instruction rather than 2, 3, or 4 instructions.

Scale field 1260—its content allows for the scaling of the index field's content for memory address generation (e.g., for address generation that uses $2^{scale}*$index+base).

Displacement Field 1262A—its content is used as part of memory address generation (e.g., for address generation that uses $2^{scale}*$index+base+displacement).

Displacement Factor Field 1262B (note that the juxtaposition of displacement field 1262A directly over displacement factor field 1262B indicates one or the other is used)—its content is used as part of address generation; it specifies a displacement factor that is to be scaled by the size of a memory access (N)—where N is the number of bytes in the memory access (e.g., for address generation that uses $2^{scale}*$index+base+scaled displacement). Redundant low-order bits are ignored and hence, the displacement factor field's content is multiplied by the memory operands total size (N) in order to generate the final displacement to be used in calculating an effective address. The value of N is determined by the processor hardware at runtime based on the full opcode field 1274 (described later herein) and the data manipulation field 1254C. The displacement field 1262A and the displacement factor field 1262B are optional in the sense that they are not used for the no memory access 1205 instruction templates and/or different embodiments may implement only one or none of the two.

Data element width field 1264—its content distinguishes which one of a number of data element widths is to be used (in some embodiments for all instructions; in other embodiments for only some of the instructions). This field is optional in the sense that it is not needed if only one data element width is supported and/or data element widths are supported using some aspect of the opcodes.

Write mask field 1270—its content controls, on a per data element position basis, whether that data element position in the destination vector operand reflects the result of the base operation and augmentation operation. Class A instruction templates support merging-writemasking, while class B instruction templates support both merging- and zeroing-writemasking. When merging, vector masks allow any set of elements in the destination to be protected from updates during the execution of any operation (specified by the base operation and the augmentation operation); in other one embodiment, preserving the old value of each element of the destination where the corresponding mask bit has a 0. In contrast, when zeroing, vector masks allow any set of elements in the destination to be zeroed during the execution of any operation (specified by the base operation and the augmentation operation); in one embodiment, an element of the destination is set to 0 when the corresponding mask bit has a 0 value. A subset of this functionality is the ability to control the vector length of the operation being performed (that is, the span of elements being modified, from the first to the last one); however, it is not necessary that the elements that are modified be consecutive. Thus, the write mask field 1270 allows for partial vector operations, including loads, stores, arithmetic, logical, etc. While embodiments of the disclosure are described in which the write mask field's 1270 content selects one of a number of write mask registers that contains the write mask to be used (and thus the write mask field's 1270 content indirectly identifies that masking to be performed), alternative embodiments instead or additional allow the mask write field's 1270 content to directly specify the masking to be performed.

Immediate field 1272—its content allows for the specification of an immediate. This field is optional in the sense that is it not present in an implementation of the generic vector friendly format that does not support immediate and it is not present in instructions that do not use an immediate.

Class field 1268—its content distinguishes between different classes of instructions. With reference to FIGS. 12A-B, the contents of this field select between class A and class B instructions. In FIGS. 12A-B, rounded corner squares are used to indicate a specific value is present in a field (e.g., class A 1268A and class B 1268B for the class field 1268 respectively in FIGS. 12A-B).

Instruction Templates of Class A

In the case of the non-memory access 1205 instruction templates of class A, the alpha field 1252 is interpreted as an RS field 1252A, whose content distinguishes which one of the different augmentation operation types are to be performed (e.g., round 1252A.1 and data transform 1252A.2 are respectively specified for the no memory access, round type operation 1210 and the no memory access, data transform type operation 1215 instruction templates), while the beta field 1254 distinguishes which of the operations of the specified type is to be performed. In the no memory access 1205 instruction templates, the scale field 1260, the displacement field 1262A, and the displacement scale filed 1262B are not present.

No-Memory Access Instruction Templates—Full Round Control Type Operation

In the no memory access full round control type operation 1210 instruction template, the beta field 1254 is interpreted as a round control field 1254A, whose content(s) provide static rounding. While in the described embodiments of the disclosure the round control field 1254A includes a suppress all floating point exceptions (SAE) field 1256 and a round operation control field 1258, alternative embodiments may support may encode both these concepts into the same field or only have one or the other of these concepts/fields (e.g., may have only the round operation control field 1258).

SAE field 1256—its content distinguishes whether or not to disable the exception event reporting; when the SAE field's 1256 content indicates suppression is enabled, a given instruction does not report any kind of floating-point exception flag and does not raise any floating point exception handler.

Round operation control field 1258—its content distinguishes which one of a group of rounding operations to perform (e.g., Round-up, Round-down, Round-towards-zero and Round-to-nearest). Thus, the round operation control field 1258 allows for the changing of the rounding mode on a per instruction basis. In one embodiment of the disclosure where a processor includes a control register for specifying rounding modes, the round operation control field's 1250 content overrides that register value.

No Memory Access Instruction Templates—Data Transform Type Operation

In the no memory access data transform type operation 1215 instruction template, the beta field 1254 is interpreted as a data transform field 1254B, whose content distinguishes which one of a number of data transforms is to be performed (e.g., no data transform, swizzle, broadcast).

In the case of a memory access 1220 instruction template of class A, the alpha field 1252 is interpreted as an eviction hint field 1252B, whose content distinguishes which one of the eviction hints is to be used (in FIG. 12A, temporal 1252B.1 and non-temporal 1252B.2 are respectively specified for the memory access, temporal 1225 instruction template and the memory access, non-temporal 1230 instruction template), while the beta field 1254 is interpreted as a data manipulation field 1254C, whose content distinguishes which one of a number of data manipulation operations (also known as primitives) is to be performed (e.g., no manipulation; broadcast; up conversion of a source; and down conversion of a destination). The memory access 1220 instruction templates include the scale field 1260, and optionally the displacement field 1262A or the displacement scale field 1262B.

Vector memory instructions perform vector loads from and vector stores to memory, with conversion support. As with regular vector instructions, vector memory instructions transfer data from/to memory in a data element-wise fashion, with the elements that are actually transferred is dictated by the contents of the vector mask that is selected as the write mask.

Memory Access Instruction Templates—Temporal

Temporal data is data likely to be reused soon enough to benefit from caching. This is, however, a hint, and different processors may implement it in different ways, including ignoring the hint entirely.

Memory Access Instruction Templates—Non-Temporal

Non-temporal data is data unlikely to be reused soon enough to benefit from caching in the 1st-level cache and should be given priority for eviction. This is, however, a hint, and different processors may implement it in different ways, including ignoring the hint entirely.

Instruction Templates of Class B

In the case of the instruction templates of class B, the alpha field 1252 is interpreted as a write mask control (Z) field 1252C, whose content distinguishes whether the write masking controlled by the write mask field 1270 should be a merging or a zeroing.

In the case of the non-memory access 1205 instruction templates of class B, part of the beta field 1254 is interpreted as an RL field 1257A, whose content distinguishes which one of the different augmentation operation types are to be performed (e.g., round 1257A.1 and vector length (VSIZE) 1257A.2 are respectively specified for the no memory access, write mask control, partial round control type operation 1212 instruction template and the no memory access, write mask control, VSIZE type operation 1217 instruction template), while the rest of the beta field 1254 distinguishes which of the operations of the specified type is to be performed. In the no memory access 1205 instruction templates, the scale field 1260, the displacement field 1262A, and the displacement scale filed 1262B are not present.

In the no memory access, write mask control, partial round control type operation 1210 instruction template, the rest of the beta field 1254 is interpreted as a round operation field 1259A and exception event reporting is disabled (a given instruction does not report any kind of floating-point exception flag and does not raise any floating point exception handler).

Round operation control field 1259A—just as round operation control field 1258, its content distinguishes which one of a group of rounding operations to perform (e.g., Round-up, Round-down, Round-towards-zero and Round-to-nearest). Thus, the round operation control field 1259A allows for the changing of the rounding mode on a per instruction basis. In one embodiment of the disclosure where a processor includes a control register for specifying rounding modes, the round operation control field's 1250 content overrides that register value.

In the no memory access, write mask control, VSIZE type operation 1217 instruction template, the rest of the beta field 1254 is interpreted as a vector length field 1259B, whose content distinguishes which one of a number of data vector lengths is to be performed on (e.g., 128, 256, or 512 byte).

In the case of a memory access 1220 instruction template of class B, part of the beta field 1254 is interpreted as a broadcast field 1257B, whose content distinguishes whether or not the broadcast type data manipulation operation is to be performed, while the rest of the beta field 1254 is interpreted the vector length field 1259B. The memory access 1220 instruction templates include the scale field 1260, and optionally the displacement field 1262A or the displacement scale field 1262B.

With regard to the generic vector friendly instruction format 1200, a full opcode field 1274 is shown including the format field 1240, the base operation field 1242, and the data element width field 1264. While one embodiment is shown where the full opcode field 1274 includes all of these fields, the full opcode field 1274 includes less than all of these fields in embodiments that do not support all of them. The full opcode field 1274 provides the operation code (opcode).

The augmentation operation field 1250, the data element width field 1264, and the write mask field 1270 allow these features to be specified on a per instruction basis in the generic vector friendly instruction format.

The combination of write mask field and data element width field create typed instructions in that they allow the mask to be applied based on different data element widths.

The various instruction templates found within class A and class B are beneficial in different situations. In some embodiments of the disclosure, different processors or different cores within a processor may support only class A, only class B, or both classes. For instance, a high performance general purpose out-of-order core intended for general-purpose computing may support only class B, a core intended primarily for graphics and/or scientific (throughput) computing may support only class A, and a core intended for both may support both (of course, a core that has some mix of templates and instructions from both classes but not all templates and instructions from both classes is within the purview of the disclosure). Also, a single processor may include multiple cores, all of which support the same class or in which different cores support different class. For instance, in a processor with separate graphics and general purpose cores, one of the graphics cores intended primarily for graphics and/or scientific computing may support only class A, while one or more of the general purpose cores may be high performance general purpose cores with out of order execution and register renaming intended for general-purpose computing that support only class B. Another processor that does not have a separate graphics core, may include one more general purpose in-order or out-of-order cores that support both class A and class B. Of course, features from one class may also be implement in the other class in different embodiments of the disclosure. Programs written in a high level language would be put (e.g., just in time compiled or statically compiled) into an variety of different executable forms, including: 1) a form having only instructions of the class(es) supported by the target processor for execution; or 2) a form having alternative routines written using different combinations of the instructions of all classes and having control flow code that selects the routines to execute based on the instructions supported by the processor which is currently executing the code.

Exemplary Specific Vector Friendly Instruction Format

FIG. 13 is a block diagram illustrating an exemplary specific vector friendly instruction format according to embodiments of the disclosure. FIG. 13 shows a specific vector friendly instruction format 1300 that is specific in the sense that it specifies the location, size, interpretation, and order of the fields, as well as values for some of those fields. The specific vector friendly instruction format 1300 may be used to extend the x86 instruction set, and thus some of the fields are similar or the same as those used in the existing x86 instruction set and extension thereof (e.g., AVX). This format remains consistent with the prefix encoding field, real opcode byte field, MOD R/M field, SIB field, displacement field, and immediate fields of the existing x86 instruction set with extensions. The fields from FIG. 12 into which the fields from FIG. 13 map are illustrated.

It should be understood that, although embodiments of the disclosure are described with reference to the specific vector friendly instruction format 1300 in the context of the generic vector friendly instruction format 1200 for illustrative purposes, the disclosure is not limited to the specific vector friendly instruction format 1300 except where claimed. For example, the generic vector friendly instruction format 1200 contemplates a variety of possible sizes for the various fields, while the specific vector friendly instruction format 1300 is shown as having fields of specific sizes. By way of specific example, while the data element width field 1264 is illustrated as a one bit field in the specific vector friendly instruction format 1300, the disclosure is not so limited (that is, the generic vector friendly instruction format 1200 contemplates other sizes of the data element width field 1264).

The generic vector friendly instruction format 1200 includes the following fields listed below in the order illustrated in FIG. 13A.

EVEX Prefix (Bytes 0-3) 1302—is encoded in a four-byte form.

Format Field 1240 (EVEX Byte 0, bits [7:0])—the first byte (EVEX Byte 0) is the format field 1240 and it contains 0x62 (the unique value used for distinguishing the vector friendly instruction format in one embodiment of the disclosure).

The second-fourth bytes (EVEX Bytes 1-3) include a number of bit fields providing specific capability.

REX field 1305 (EVEX Byte 1, bits [7-5])—consists of a EVEX.R bit field (EVEX Byte 1, bit [7]-R), EVEX.X bit field (EVEX byte 1, bit [6]-X), and 1257BEX byte 1, bit[5]-B). The EVEX.R, EVEX.X, and EVEX.B bit fields provide the same functionality as the corresponding VEX bit fields, and are encoded using 1s complement form, i.e. ZMM0 is encoded as 1111B, ZMM15 is encoded as 0000B. Other fields of the instructions encode the lower three bits of the register indexes as is known in the art (rrr, xxx, and bbb), so that Rrrr, Xxxx, and Bbbb may be formed by adding EVEX.R, EVEX.X, and EVEX.B.

REX' field 1210—this is the first part of the REX' field 1210 and is the EVEX.R' bit field (EVEX Byte 1, bit [4]-R') that is used to encode either the upper 16 or lower 16 of the extended 32 register set. In one embodiment of the disclosure, this bit, along with others as indicated below, is stored in bit inverted format to distinguish (in the well-known x86 32-bit mode) from the BOUND instruction, whose real opcode byte is 62, but does not accept in the MOD R/M field (described below) the value of 11 in the MOD field; alternative embodiments of the disclosure do not store this and the other indicated bits below in the inverted format. A value of 1 is used to encode the lower 16 registers. In other words, R'Rrrr is formed by combining EVEX.R', EVEX.R, and the other RRR from other fields.

Opcode map field 1315 (EVEX byte 1, bits [3:0]-mmmm)—its content encodes an implied leading opcode byte (0F, 0F 38, or 0F 3).

Data element width field 1264 (EVEX byte 2, bit [7]-W)—is represented by the notation EVEX.W. EVEX.W is used to define the granularity (size) of the datatype (either 32-bit data elements or 64-bit data elements).

EVEX.vvvv 1320 (EVEX Byte 2, bits [6:3]-vvvv)—the role of EVEX.vvvv may include the following: 1) EVEX.vvvv encodes the first source register operand, specified in inverted (1s complement) form and is valid for instructions with 2 or more source operands; 2) EVEX.vvvv encodes the destination register operand, specified in 1s complement form for certain vector shifts; or 3) EVEX.vvvv does not encode any operand, the field is reserved and should contain 1111b. Thus, EVEX.vvvv field 1320 encodes the 4 low-order bits of the first source register specifier stored in inverted (1s complement) form. Depending on the instruction, an extra different EVEX bit field is used to extend the specifier size to 32 registers.

EVEX.U 1268 Class field (EVEX byte 2, bit [2]-U)—If EVEX.U=0, it indicates class A or EVEX.U0; if EVEX.U=1, it indicates class B or EVEX.U1.

Prefix encoding field 1325 (EVEX byte 2, bits [1:0]-pp)—provides additional bits for the base operation field. In addition to providing support for the legacy SSE instructions in the EVEX prefix format, this also has the benefit of compacting the SIMD prefix (rather than requiring a byte to express the SIMD prefix, the EVEX prefix requires only 2 bits). In one embodiment, to support legacy SSE instructions that use a SIMD prefix (66H, F2H, F3H) in both the legacy format and in the EVEX prefix format, these legacy SIMD prefixes are encoded into the SIMD prefix encoding field; and at runtime are expanded into the legacy SIMD prefix prior to being provided to the decoder's PLA (so the PLA can execute both the legacy and EVEX format of these legacy instructions without modification). Although newer instructions could use the EVEX prefix encoding field's content directly as an opcode extension, certain embodiments expand in a similar fashion for consistency but allow for different meanings to be specified by these legacy SIMD prefixes. An alternative embodiment may redesign the PLA to support the 2 bit SIMD prefix encodings, and thus not require the expansion.

Alpha field 1252 (EVEX byte 3, bit [7]-EH; also known as EVEX.EH, EVEX.rs, EVEX.RL, EVEX.write mask control, and EVEX.N; also illustrated with a)—as previously described, this field is context specific.

Beta field 1254 (EVEX byte 3, bits [6:4]-SSS, also known as EVEX.$s_{2-0}$, EVEX.$r_{2-0}$, EVEX.rr1, EVEX.LL0, EVEX.LLB; also illustrated with βββ)—as previously described, this field is context specific.

REX' field 1210—this is the remainder of the REX' field and is the EVEX.V' bit field (EVEX Byte 3, bit [3]-V') that may be used to encode either the upper 16 or lower 16 of the extended 32 register set. This bit is stored in bit inverted format. A value of 1 is used to encode the lower 16 registers. In other words, V'VVVV is formed by combining EVEX.V', EVEX.vvvv.

Write mask field 1270 (EVEX byte 3, bits [2:0]-kkk)—its content specifies the index of a register in the write mask registers as previously described. In one embodiment of the disclosure, the specific value EVEX kkk=000 has a special behavior implying no write mask is used for the particular instruction (this may be implemented in a variety of ways including the use of a write mask hardwired to all ones or hardware that bypasses the masking hardware).

Real Opcode Field 1330 (Byte 4) is also known as the opcode byte. Part of the opcode is specified in this field.

MOD R/M Field 1340 (Byte 5) includes MOD field 1342, Reg field 1344, and R/M field 1346. As previously described, the MOD field's 1342 content distinguishes between memory access and non-memory access operations. The role of Reg field 1344 can be summarized to two situations: encoding either the destination register operand or a source register operand, or be treated as an opcode extension and not used to encode any instruction operand. The role of R/M field 1346 may include the following: encoding the instruction operand that references a memory address, or encoding either the destination register operand or a source register operand.

Scale, Index, Base (SIB) Byte (Byte 6)—As previously described, the scale field's 1250 content is used for memory address generation. SIB.xxx 1354 and SIB.bbb 1356—the contents of these fields have been previously referred to with regard to the register indexes Xxxx and Bbbb.

Displacement field 1262A (Bytes 7-10)—when MOD field 1342 contains 10, bytes 7-10 are the displacement field 1262A, and it works the same as the legacy 32-bit displacement (disp32) and works at byte granularity.

Displacement factor field 1262B (Byte 7)—when MOD field 1342 contains 01, byte 7 is the displacement factor field 1262B. The location of this field is that same as that of the legacy x86 instruction set 8-bit displacement (disp8), which works at byte granularity. Since disp8 is sign extended, it can only address between −128 and 127 bytes offsets; in terms of 64 byte cache lines, disp8 uses 8 bits that can be set to only four really useful values −128, −64, 0, and 64; since a greater range is often needed, disp32 is used; however, disp32 requires 4 bytes. In contrast to disp8 and disp32, the displacement factor field 1262B is a reinterpretation of disp8; when using displacement factor field 1262B, the actual displacement is determined by the content of the displacement factor field multiplied by the size of the memory operand access (N). This type of displacement is referred to as disp8*N. This reduces the average instruction length (a single byte of used for the displacement but with a much greater range). Such compressed displacement is based on the assumption that the effective displacement is multiple of the granularity of the memory access, and hence, the redundant low-order bits of the address offset do not need to be encoded. In other words, the displacement factor field 1262B substitutes the legacy x86 instruction set 8-bit displacement. Thus, the displacement factor field 1262B is encoded the same way as an x86 instruction set 8-bit displacement (so no changes in the ModRM/SIB encoding rules) with the only exception that disp8 is overloaded to disp8*N. In other words, there are no changes in the encoding rules or encoding lengths but only in the interpretation of the displacement value by hardware (which needs to scale the displacement by the size of the memory operand to obtain a byte-wise address offset). Immediate field 1272 operates as previously described.

Full Opcode Field

FIG. 13B is a block diagram illustrating the fields of the specific vector friendly instruction format 1300 that make up the full opcode field 1274 according to one embodiment of the disclosure. Specifically, the full opcode field 1274 includes the format field 1240, the base operation field 1242, and the data element width (W) field 1264. The base operation field 1242 includes the prefix encoding field 1325, the opcode map field 1315, and the real opcode field 1330.

Register Index Field

FIG. 13C is a block diagram illustrating the fields of the specific vector friendly instruction format 1300 that make up the register index field 1244 according to one embodiment of the disclosure. Specifically, the register index field 1244 includes the REX field 1305, the REX' field 1310, the MODR/M.reg field 1344, the MODR/M.r/m field 1346, the VVVV field 1320, xxx field 1354, and the bbb field 1356.

Augmentation Operation Field

Figure 13D:
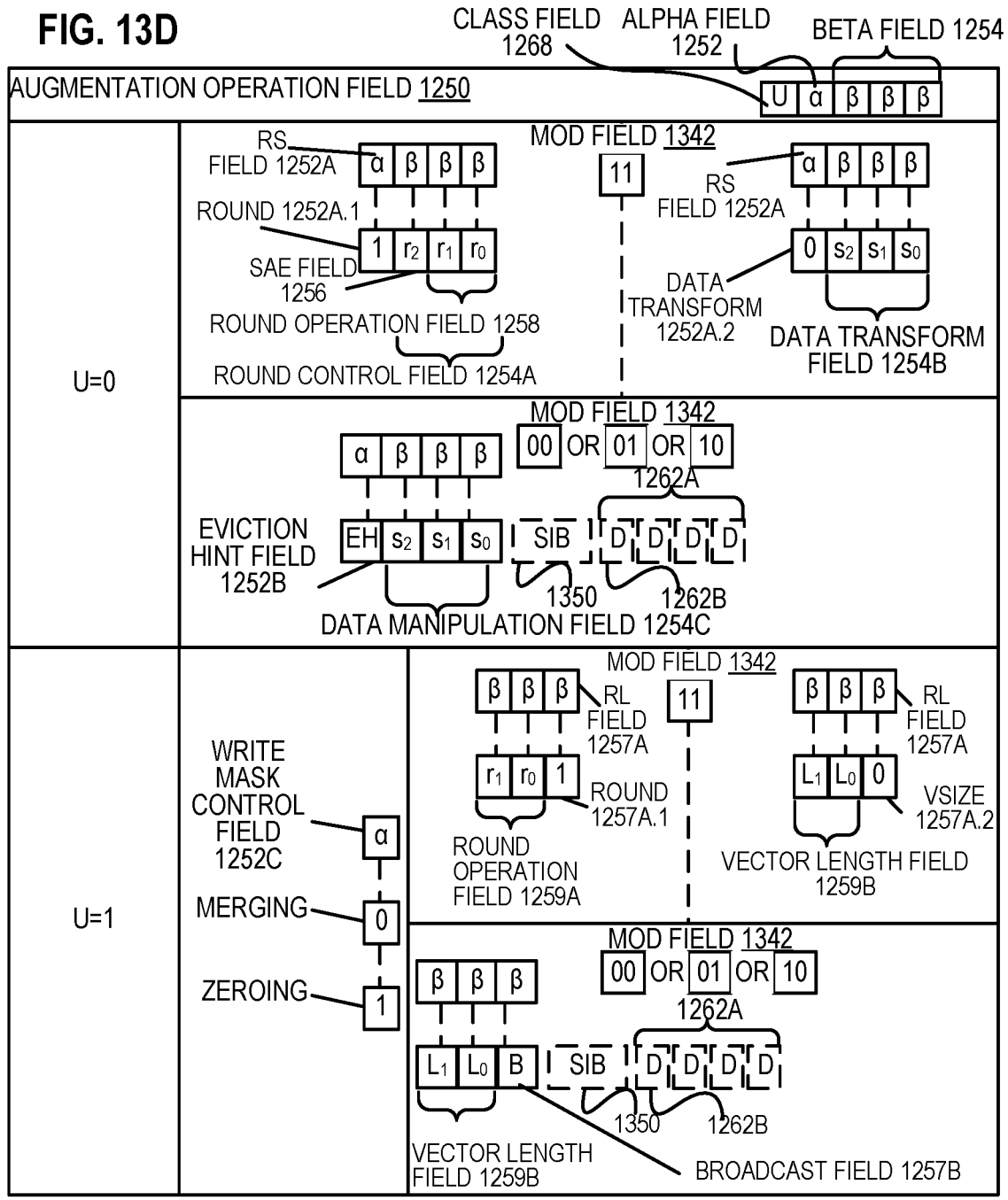
FIG. 13D is a block diagram illustrating the fields of the specific vector friendly instruction format in FIG. 13A that make up the augmentation operation field 1250 according to one embodiment of the disclosure.

FIG. 13D is a block diagram illustrating the fields of the specific vector friendly instruction format 1300 that make up the augmentation operation field 1250 according to one embodiment of the disclosure. When the class (U) field 1268 contains 0, it signifies EVEX.U0 (class A 1268A); when it contains 1, it signifies EVEX.U1 (class B 1268B). When U=0 and the MOD field 1342 contains 11 (signifying a no memory access operation), the alpha field 1252 (EVEX byte 3, bit [7]-EH) is interpreted as the rs field 1252A. When the rs field 1252A contains a 1 (round 1252A.1), the beta field 1254 (EVEX byte 3, bits [6:4]-SSS) is interpreted as the round control field 1254A. The round control field 1254A includes a one bit SAE field 1256 and a two bit round operation field 1258. When the rs field 1252A contains a 0 (data transform 1252A.2), the beta field 1254 (EVEX byte 3, bits [6:4]-SSS) is interpreted as a three bit data transform field 1254B. When U=0 and the MOD field 1342 contains 00, 01, or 10 (signifying a memory access operation), the alpha field 1252 (EVEX byte 3, bit [7]-EH) is interpreted as the eviction hint (EH) field 1252B and the beta field 1254 (EVEX byte 3, bits [6:4]-SSS) is interpreted as a three bit data manipulation field 1254C.

When U=1, the alpha field 1252 (EVEX byte 3, bit [7]-EH) is interpreted as the write mask control (Z) field 1252C. When U=1 and the MOD field 1342 contains 11 (signifying a no memory access operation), part of the beta field 1254 (EVEX byte 3, bit [4]-$S_0$) is interpreted as the RL field 1257A; when it contains a 1 (round 1257A.1) the rest of the beta field 1254 (EVEX byte 3, bit [6-5]-$S_{2-1}$) is interpreted as the round operation field 1259A, while when the RL field 1257A contains a 0 (VSIZE 1257.A2) the rest of the beta field 1254 (EVEX byte 3, bit [6-5]-$S_{2-1}$) is interpreted as the vector length field 1259B (EVEX byte 3, bit [6-5]-$L_{1-0}$). When U=1 and the MOD field 1342 contains 00, 01, or 10 (signifying a memory access operation), the beta field 1254 (EVEX byte 3, bits [6:4]-SSS) is interpreted as the vector length field 1259B (EVEX byte 3, bit [6-5]-$L_{1-0}$) and the broadcast field 1257B (EVEX byte 3, bit [4]-B).

Exemplary Register Architecture

Figure 14:
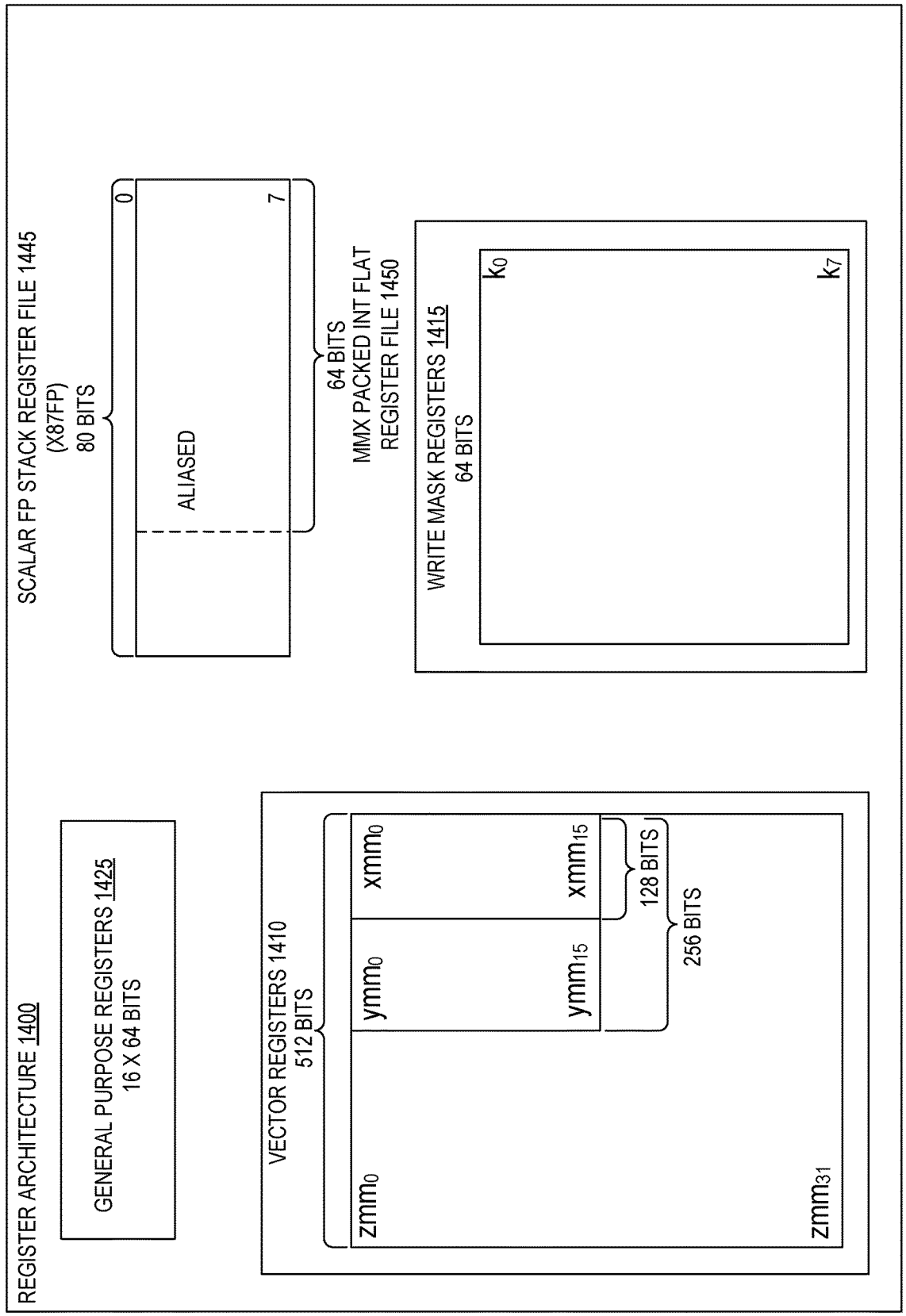
FIG. 14 is a block diagram of a register architecture according to one embodiment of the disclosure

FIG. 14 is a block diagram of a register architecture 1400 according to one embodiment of the disclosure. In the embodiment illustrated, there are 32 vector registers 1410 that are 512 bits wide; these registers are referenced as zmm0 through zmm31. The lower order 256 bits of the lower 16 zmm registers are overlaid on registers ymm0-16. The lower order 128 bits of the lower 16 zmm registers (the lower order 128 bits of the ymm registers) are overlaid on registers xmm0-15. The specific vector friendly instruction format 1300 operates on these overlaid register file as illustrated in the below tables.

| Adjustable Vector Length | Class | Operations | Registers |
|---|---|---|---|
| Instruction Templates that do not include the vector length field 1259B | A (FIG. 12A; U = 0) | 1210, 1215, 1225, 1230 | zmm registers (the vector length is 64 byte) |
| | B (FIG. 12B; U = 1) | 1212 | zmm registers (the vector length is 64 byte) |
| Instruction templates that do include the vector length field 1259B | B (FIG. 12B; U = 1) | 1217, 1227 | zmm, ymm, or xmm registers (the vector length is 64 byte, 32 byte, or 16 byte) depending on the vector length field 1259B |

In other words, the vector length field 1259B selects between a maximum length and one or more other shorter lengths, where each such shorter length is half the length of the preceding length; and instructions templates without the vector length field 1259B operate on the maximum vector length. Further, in one embodiment, the class B instruction templates of the specific vector friendly instruction format 1300 operate on packed or scalar single/double-precision floating point data and packed or scalar integer data. Scalar operations are operations performed on the lowest order data element position in an zmm/ymm/xmm register; the higher order data element positions are either left the same as they were prior to the instruction or zeroed depending on the embodiment.

Write mask registers 1415—in the embodiment illustrated, there are 8 write mask registers (k0 through k7), each 64 bits in size. In an alternate embodiment, the write mask registers 1415 are 16 bits in size. As previously described, in one embodiment of the disclosure, the vector mask register k0 cannot be used as a write mask; when the encoding that would normally indicate k0 is used for a write mask, it selects a hardwired write mask of 0xFFFF, effectively disabling write masking for that instruction.

General-purpose registers 1425—in the embodiment illustrated, there are sixteen 64-bit general-purpose registers that are used along with the existing x86 addressing modes to address memory operands. These registers are referenced by the names RAX, RBX, RCX, RDX, RBP, RSI, RDI, RSP, and R8 through R15.

Scalar floating point stack register file (x87 stack) 1445, on which is aliased the MMX packed integer flat register file 1450—in the embodiment illustrated, the x87 stack is an eight-element stack used to perform scalar floating-point operations on 32/64/80-bit floating point data using the x87 instruction set extension; while the MMX registers are used to perform operations on 64-bit packed integer data, as well as to hold operands for some operations performed between the MMX and XMM registers.

Alternative embodiments of the disclosure may use wider or narrower registers. Additionally, alternative embodiments of the disclosure may use more, less, or different register files and registers.

Exemplary Core Architectures, Processors, and Computer Architectures

Processor cores may be implemented in different ways, for different purposes, and in different processors. For instance, implementations of such cores may include: 1) a general purpose in-order core intended for general-purpose computing; 2) a high performance general purpose out-of-order core intended for general-purpose computing; 3) a special purpose core intended primarily for graphics and/or scientific (throughput) computing. Implementations of different processors may include: 1) a CPU including one or more general purpose in-order cores intended for general-purpose computing and/or one or more general purpose out-of-order cores intended for general-purpose computing; and 2) a coprocessor including one or more special purpose cores intended primarily for graphics and/or scientific (throughput). Such different processors lead to different computer system architectures, which may include: 1) the coprocessor on a separate chip from the CPU; 2) the coprocessor on a separate die in the same package as a CPU; 3) the coprocessor on the same die as a CPU (in which case, such a coprocessor is sometimes referred to as special purpose logic, such as integrated graphics and/or scientific (throughput) logic, or as special purpose cores); and 4) a system on a chip that may include on the same die the described CPU (sometimes referred to as the application core(s) or application processor(s)), the above described coprocessor, and additional functionality. Exemplary core architectures are described next, followed by descriptions of exemplary processors and computer architectures.

Exemplary Core Architectures

In-Order and Out-of-Order Core Block Diagram

FIG. 15A is a block diagram illustrating both an exemplary in-order pipeline and an exemplary register renaming, out-of-order issue/execution pipeline according to embodiments of the disclosure. FIG. 15B is a block diagram illustrating both an exemplary embodiment of an in-order architecture core and an exemplary register renaming, out-of-order issue/execution architecture core to be included in a processor according to embodiments of the disclosure. The solid lined boxes in FIGS. 15A-B illustrate the in-order pipeline and in-order core, while the optional addition of the dashed lined boxes illustrates the register renaming, out-of-order issue/execution pipeline and core. Given that the in-order aspect is a subset of the out-of-order aspect, the out-of-order aspect will be described.

In FIG. 15A, a processor pipeline 1500 includes a fetch stage 1502, a length decode stage 1504, a decode stage 1506, an allocation stage 1508, a renaming stage 1510, a scheduling (also known as a dispatch or issue) stage 1512, a register read/memory read stage 1514, an execute stage 1516, a write back/memory write stage 1518, an exception handling stage 1522, and a commit stage 1524.

FIG. 15B shows processor core 1590 including a front end unit 1530 coupled to an execution engine unit 1550, and both are coupled to a memory unit 1570. The core 1590 may be a reduced instruction set computing (RISC) core, a complex instruction set computing (CISC) core, a very long instruction word (VLIW) core, or a hybrid or alternative core type. As yet another option, the core 1590 may be a special-purpose core, such as, for example, a network or communication core, compression engine, coprocessor core, general purpose computing graphics processing unit (GPGPU) core, graphics core, or the like.

The front end unit 1530 includes a branch prediction unit 1532 coupled to an instruction cache unit 1534, which is coupled to an instruction translation lookaside buffer (TLB) 1536, which is coupled to an instruction fetch unit 1538, which is coupled to a decode unit 1540. The decode unit 1540 (or decoder or decoder unit) may decode instructions (e.g., macro-instructions), and generate as an output one or more micro-operations, micro-code entry points, microinstructions, other instructions, or other control signals, which are decoded from, or which otherwise reflect, or are derived from, the original instructions. The decode unit 1540 may be implemented using various different mechanisms. Examples of suitable mechanisms include, but are not limited to, look-up tables, hardware implementations, programmable logic arrays (PLAs), microcode read only memories (ROMs), etc. In one embodiment, the core 1590 includes a microcode ROM or other medium that stores microcode for certain macro-instructions (e.g., in decode unit 1540 or otherwise within the front end unit 1530). The decode unit 1540 is coupled to a rename/allocator unit 1552 in the execution engine unit 1550.

The execution engine unit 1550 includes the rename/allocator unit 1552 coupled to a retirement unit 1554 and a set of one or more scheduler unit(s) 1556. The scheduler unit(s) 1556 represents any number of different schedulers, including reservations stations, central instruction window, etc. The scheduler unit(s) 1556 is coupled to the physical register file(s) unit(s) 1558. Each of the physical register file(s) units 1558 represents one or more physical register files, different ones of which store one or more different data types, such as scalar integer, scalar floating point, packed integer, packed floating point, vector integer, vector floating point, status (e.g., an instruction pointer that is the address of the next instruction to be executed), etc. In one embodiment, the physical register file(s) unit 1558 comprises a vector registers unit, a write mask registers unit, and a scalar registers unit. These register units may provide architectural vector registers, vector mask registers, and general purpose registers. The physical register file(s) unit(s) 1558 is overlapped by the retirement unit 1554 to illustrate various ways in which register renaming and out-of-order execution may be implemented (e.g., using a reorder buffer(s) and a retirement register file(s); using a future file(s), a history buffer(s), and a retirement register file(s); using a register maps and a pool of registers; etc.). The retirement unit 1554 and the physical register file(s) unit(s) 1558 are coupled to the execution cluster(s) 1560. The execution cluster(s) 1560 includes a set of one or more execution units 1562 and a set of one or more memory access units 1564. The execution units 1562 may perform various operations (e.g., shifts, addition, subtraction, multiplication) and on various types of data (e.g., scalar floating point, packed integer, packed floating point, vector integer, vector floating point). While some embodiments may include a number of execution units dedicated to specific functions or sets of functions, other embodiments may include only one execution unit or multiple execution units that all perform all functions. The scheduler unit(s) 1556, physical register file(s) unit(s) 1558, and execution cluster(s) 1560 are shown as being possibly plural because certain embodiments create separate pipelines for certain types of data/operations (e.g., a scalar integer pipeline, a scalar floating point/packed integer/packed floating point/vector integer/vector floating point pipeline, and/or a memory access pipeline that each have their own scheduler unit, physical register file(s) unit, and/or execution cluster—and in the case of a separate memory access pipeline, certain embodiments are implemented in which only the execution cluster of this pipeline has the memory access unit(s) 1564). It should also be understood that where separate pipelines are used, one or more of these pipelines may be out-of-order issue/execution and the rest in-order.

The set of memory access units 1564 is coupled to the memory unit 1570, which includes a data TLB unit 1572 coupled to a data cache unit 1574 coupled to a level 2 (L2) cache unit 1576. In one exemplary embodiment, the memory access units 1564 may include a load unit, a store address unit, and a store data unit, each of which is coupled to the data TLB unit 1572 in the memory unit 1570. The instruction cache unit 1534 is further coupled to a level 2 (L2) cache unit 1576 in the memory unit 1570. The L2 cache unit 1576 is coupled to one or more other levels of cache and eventually to a main memory.

In certain embodiments, a prefetch circuit 1578 is included to prefetch data, for example, to predict access addresses and bring the data for those addresses into a cache or caches (e.g., from memory 1580).

By way of example, the exemplary register renaming, out-of-order issue/execution core architecture may implement the pipeline 1500 as follows: 1) the instruction fetch 1538 performs the fetch and length decoding stages 1502 and 1504; 2) the decode unit 1540 performs the decode stage 1506; 3) the rename/allocator unit 1552 performs the allocation stage 1508 and renaming stage 1510; 4) the scheduler unit(s) 1556 performs the schedule stage 1512; 5) the physical register file(s) unit(s) 1558 and the memory unit 1570 perform the register read/memory read stage 1514; the execution cluster 1560 perform the execute stage 1516; 6) the memory unit 1570 and the physical register file(s) unit(s) 1558 perform the write back/memory write stage 1518; 7) various units may be involved in the exception handling stage 1522; and 8) the retirement unit 1554 and the physical register file(s) unit(s) 1558 perform the commit stage 1524.

The core 1590 may support one or more instructions sets (e.g., the x86 instruction set (with some extensions that have been added with newer versions); the MIPS instruction set of MIPS Technologies of Sunnyvale, CA; the ARM instruction set (with optional additional extensions such as NEON) of ARM Holdings of Sunnyvale, CA), including the instruction(s) described herein. In one embodiment, the core 1590 includes logic to support a packed data instruction set extension (e.g., AVX1, AVX2), thereby allowing the operations used by many multimedia applications to be performed using packed data.

It should be understood that the core may support multithreading (executing two or more parallel sets of operations or threads), and may do so in a variety of ways including time sliced multithreading, simultaneous multithreading (where a single physical core provides a logical core for each of the threads that physical core is simultaneously multithreading), or a combination thereof (e.g., time sliced fetching and decoding and simultaneous multithreading thereafter such as in the Intel® Hyper-Threading technology).

While register renaming is described in the context of out-of-order execution, it should be understood that register renaming may be used in an in-order architecture. While the illustrated embodiment of the processor also includes separate instruction and data cache units 1534/1574 and a shared L2 cache unit 1576, alternative embodiments may have a single internal cache for both instructions and data, such as, for example, a Level 1 (L1) internal cache, or multiple levels of internal cache. In some embodiments, the system may include a combination of an internal cache and an external cache that is external to the core and/or the processor. Alternatively, all of the cache may be external to the core and/or the processor.

Specific Exemplary In-Order Core Architecture

Figure 16B:
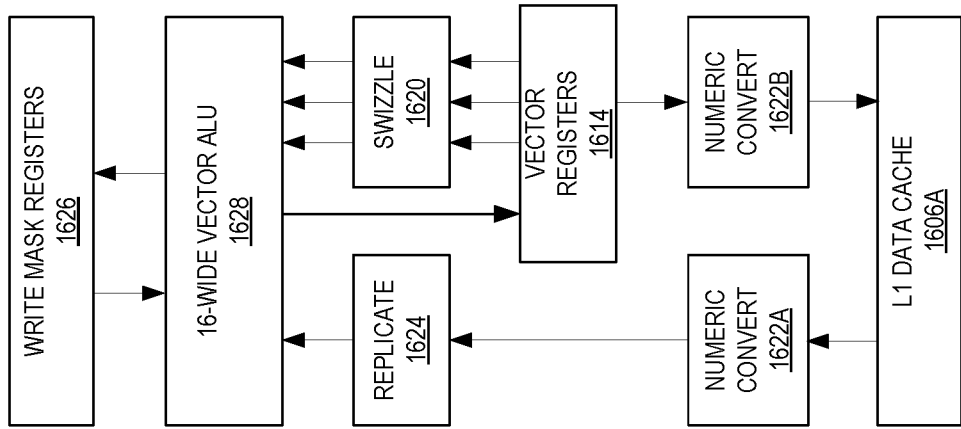
FIG. 16B is an expanded view of part of the processor core in FIG. 16A according to embodiments of the disclosure.
Figure 16A:
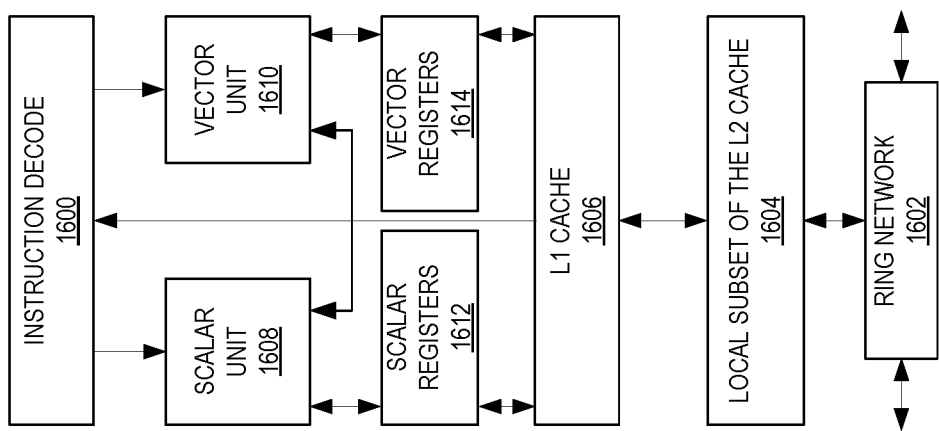
FIG. 16A is a block diagram of a single processor core, along with its connection to the on-die interconnect network and with its local subset of the Level 2 (L2) cache, according to embodiments of the disclosure.

FIGS. 16A-B illustrate a block diagram of a more specific exemplary in-order core architecture, which core would be one of several logic blocks (including other cores of the same type and/or different types) in a chip. The logic blocks communicate through a high-bandwidth interconnect network (e.g., a ring network) with some fixed function logic, memory I/O interfaces, and other necessary I/O logic, depending on the application.

FIG. 16A is a block diagram of a single processor core, along with its connection to the on-die interconnect network 1602 and with its local subset of the Level 2 (L2) cache 1604, according to embodiments of the disclosure. In one embodiment, an instruction decode unit 1600 supports the x86 instruction set with a packed data instruction set extension. An L1 cache 1606 allows low-latency accesses to cache memory into the scalar and vector units. While in one embodiment (to simplify the design), a scalar unit 1608 and a vector unit 1610 use separate register sets (respectively, scalar registers 1612 and vector registers 1614) and data transferred between them is written to memory and then read back in from a level 1 (L1) cache 1606, alternative embodiments of the disclosure may use a different approach (e.g., use a single register set or include a communication path that allow data to be transferred between the two register files without being written and read back).

The local subset of the L2 cache 1604 is part of a global L2 cache that is divided into separate local subsets, one per processor core. Each processor core has a direct access path to its own local subset of the L2 cache 1604. Data read by a processor core is stored in its L2 cache subset 1604 and can be accessed quickly, in parallel with other processor cores accessing their own local L2 cache subsets. Data written by a processor core is stored in its own L2 cache subset 1604 and is flushed from other subsets, if necessary. The ring network ensures coherency for shared data. The ring network is bi-directional to allow agents such as processor cores, L2 caches and other logic blocks to communicate with each other within the chip. Each ring data-path is 1012-bits wide per direction.

FIG. 16B is an expanded view of part of the processor core in FIG. 16A according to embodiments of the disclosure. FIG. 16B includes an L1 data cache 1606A part of the L1 cache 1604, as well as more detail regarding the vector unit 1610 and the vector registers 1614. Specifically, the vector unit 1610 is a 16-wide vector processing unit (VPU) (see the 16-wide ALU 1628), which executes one or more of integer, single-precision float, and double-precision float instructions. The VPU supports swizzling the register inputs with swizzle unit 1620, numeric conversion with numeric convert units 1622A-B, and replication with replication unit 1624 on the memory input. Write mask registers 1626 allow predicating resulting vector writes.

Figure 17:
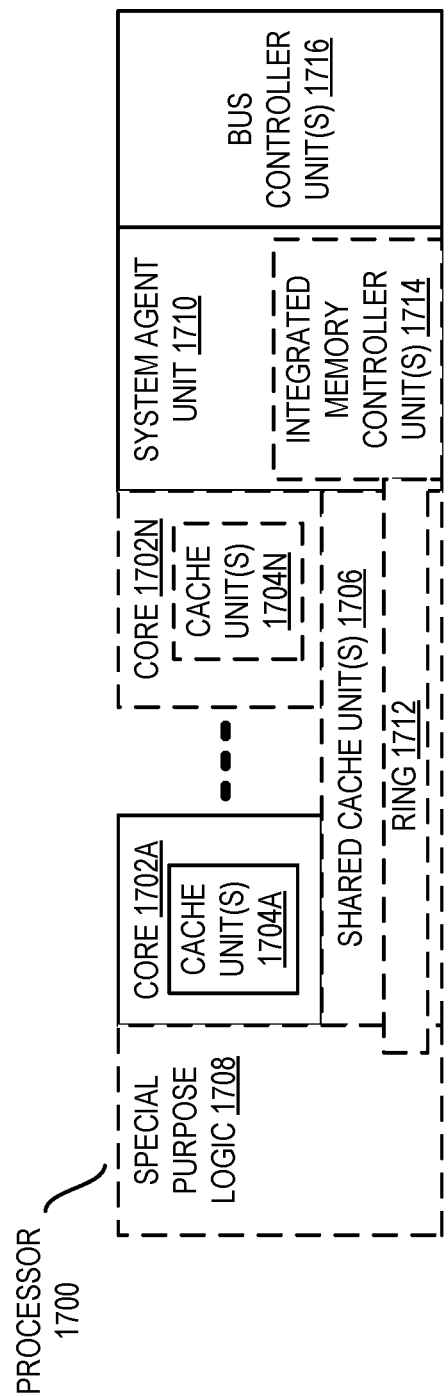
FIG. 17 is a block diagram of a processor that may have more than one core, may have an integrated memory controller, and may have integrated graphics according to embodiments of the disclosure.

FIG. 17 is a block diagram of a processor 1700 that may have more than one core, may have an integrated memory controller, and may have integrated graphics according to embodiments of the disclosure. The solid lined boxes in FIG. 17 illustrate a processor 1700 with a single core 1702A, a system agent 1710, a set of one or more bus controller units 1716, while the optional addition of the dashed lined boxes illustrates an alternative processor 1700 with multiple cores 1702A-N, a set of one or more integrated memory controller unit(s) 1714 in the system agent unit 1710, and special purpose logic 1708.

Thus, different implementations of the processor 1700 may include: 1) a CPU with the special purpose logic 1708 being integrated graphics and/or scientific (throughput) logic (which may include one or more cores), and the cores 1702A-N being one or more general purpose cores (e.g., general purpose in-order cores, general purpose out-of-order cores, a combination of the two); 2) a coprocessor with the cores 1702A-N being a large number of special purpose cores intended primarily for graphics and/or scientific (throughput); and 3) a coprocessor with the cores 1702A-N being a large number of general purpose in-order cores. Thus, the processor 1700 may be a general-purpose processor, coprocessor or special-purpose processor, such as, for example, a network or communication processor, compression engine, graphics processor, GPGPU (general purpose graphics processing unit), a high-throughput many integrated core (MIC) coprocessor (including 30 or more cores), embedded processor, or the like. The processor may be implemented on one or more chips. The processor 1700 may be a part of and/or may be implemented on one or more substrates using any of a number of process technologies, such as, for example, BiCMOS, CMOS, or NMOS.

The memory hierarchy includes one or more levels of cache within the cores, a set or one or more shared cache units 1706, and external memory (not shown) coupled to the set of integrated memory controller units 1714. The set of shared cache units 1706 may include one or more mid-level caches, such as level 2 (L2), level 3 (L3), level 4 (L4), or other levels of cache, a last level cache (LLC), and/or combinations thereof. While in one embodiment a ring based interconnect unit 1712 interconnects the integrated graphics logic 1708, the set of shared cache units 1706, and the system agent unit 1710/integrated memory controller unit(s) 1714, alternative embodiments may use any number of well-known techniques for interconnecting such units. In one embodiment, coherency is maintained between one or more cache units 1706 and cores 1702-A-N.

In some embodiments, one or more of the cores 1702A-N are capable of multithreading. The system agent 1710 includes those components coordinating and operating cores 1702A-N. The system agent unit 1710 may include for example a power control unit (PCU) and a display unit. The PCU may be or include logic and components needed for regulating the power state of the cores 1702A-N and the integrated graphics logic 1708. The display unit is for driving one or more externally connected displays.

The cores 1702A-N may be homogenous or heterogeneous in terms of architecture instruction set; that is, two or more of the cores 1702A-N may be capable of execution the same instruction set, while others may be capable of executing only a subset of that instruction set or a different instruction set.

Exemplary Computer Architectures

FIGS. 18-21 are block diagrams of exemplary computer architectures. Other system designs and configurations known in the arts for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, are also suitable. In general, a huge variety of systems or electronic devices capable of incorporating a processor and/or other execution logic as disclosed herein are generally suitable.

Figure 18:
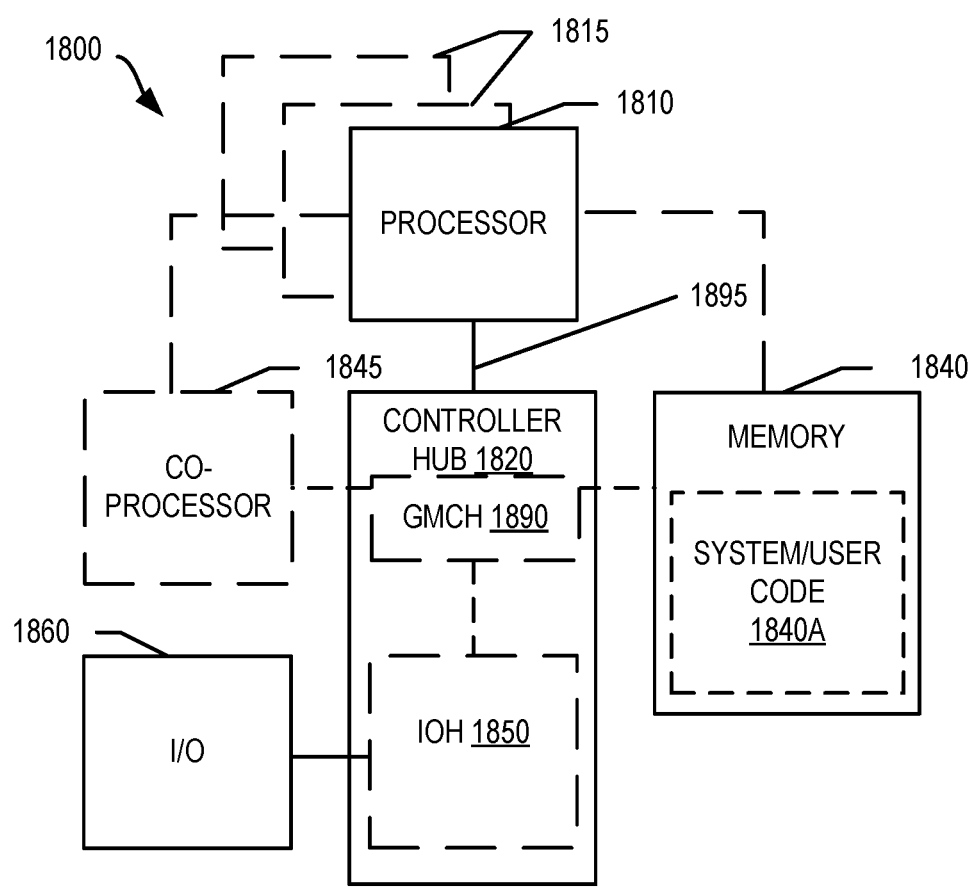
FIG. 18 is a block diagram of a system in accordance with one embodiment of the present disclosure.

Referring now to FIG. 18, shown is a block diagram of a system 1800 in accordance with one embodiment of the present disclosure. The system 1800 may include one or more processors 1810, 1815, which are coupled to a controller hub 1820. In one embodiment the controller hub 1820 includes a graphics memory controller hub (GMCH) 1890 and an Input/Output Hub (IOH) 1850 (which may be on separate chips); the GMCH 1890 includes memory and graphics controllers to which are coupled memory 1840 and a coprocessor 1845; the IOH 1850 is couples input/output (I/O) devices 1860 to the GMCH 1890. Alternatively, one or both of the memory and graphics controllers are integrated within the processor (as described herein), the memory 1840 and the coprocessor 1845 are coupled directly to the processor 1810, and the controller hub 1820 in a single chip with the IOH 1850. Memory 1840 may include system and/or user code 1840A, for example, to store code that when executed causes a processor to perform any method of this disclosure.

The optional nature of additional processors 1815 is denoted in FIG. 18 with broken lines. Each processor 1810, 1815 may include one or more of the processing cores described herein and may be some version of the processor 1700.

The memory 1840 may be, for example, dynamic random access memory (DRAM), phase change memory (PCM), or a combination of the two. For at least one embodiment, the controller hub 1820 communicates with the processor(s) 1810, 1815 via a multi-drop bus, such as a frontside bus (FSB), point-to-point interface such as Quickpath Interconnect (QPI), or similar connection 1895.

In one embodiment, the coprocessor 1845 is a special-purpose processor, such as, for example, a high-throughput MIC processor, a network or communication processor, compression engine, graphics processor, GPGPU, embedded processor, or the like. In one embodiment, controller hub 1820 may include an integrated graphics accelerator.

There can be a variety of differences between the physical resources 1810, 1815 in terms of a spectrum of metrics of merit including architectural, microarchitectural, thermal, power consumption characteristics, and the like.

In one embodiment, the processor 1810 executes instructions that control data processing operations of a general type. Embedded within the instructions may be coprocessor instructions. The processor 1810 recognizes these coprocessor instructions as being of a type that should be executed by the attached coprocessor 1845. Accordingly, the processor 1810 issues these coprocessor instructions (or control signals representing coprocessor instructions) on a coprocessor bus or other interconnect, to coprocessor 1845. Coprocessor(s) 1845 accept and execute the received coprocessor instructions.

Figure 19:
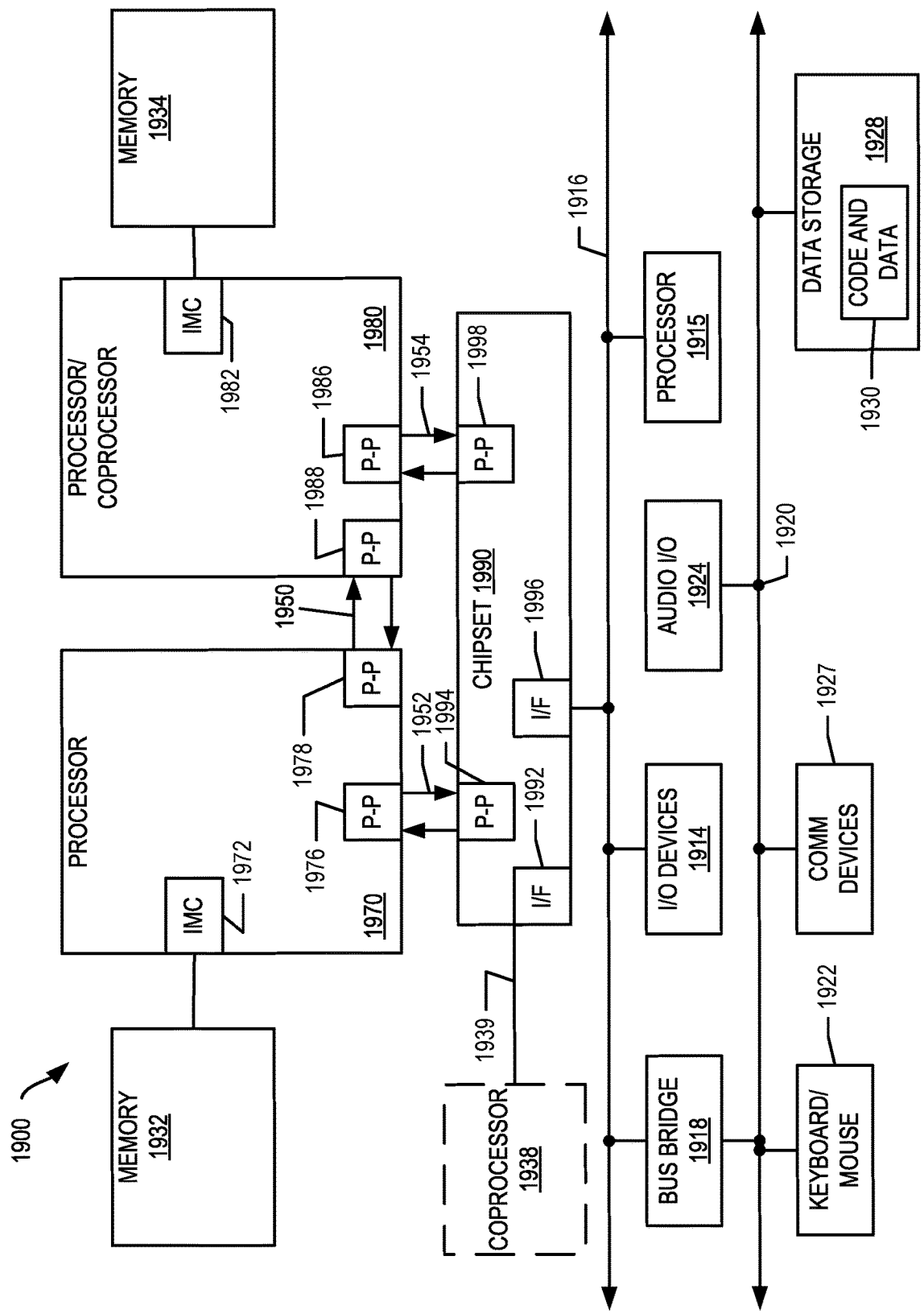
FIG. 19 is a block diagram of a more specific exemplary system in accordance with an embodiment of the present disclosure.

Referring now to FIG. 19, shown is a block diagram of a first more specific exemplary system 1900 in accordance with an embodiment of the present disclosure. As shown in FIG. 19, multiprocessor system 1900 is a point-to-point interconnect system, and includes a first processor 1970 and a second processor 1980 coupled via a point-to-point interconnect 1950. Each of processors 1970 and 1980 may be some version of the processor 1700. In one embodiment of the disclosure, processors 1970 and 1980 are respectively processors 1810 and 1815, while coprocessor 1938 is coprocessor 1845. In another embodiment, processors 1970 and 1980 are respectively processor 1810 coprocessor 1845.

Processors 1970 and 1980 are shown including integrated memory controller (IMC) units 1972 and 1982, respectively. Processor 1970 also includes as part of its bus controller units point-to-point (P-P) interfaces 1976 and 1978; similarly, second processor 1980 includes P-P interfaces 1986 and 1988. Processors 1970, 1980 may exchange information via a point-to-point (P-P) interface 1950 using P-P interface circuits 1978, 1988. As shown in FIG. 19, IMCs 1972 and 1982 couple the processors to respective memories, namely a memory 1932 and a memory 1934, which may be portions of main memory locally attached to the respective processors.

Processors 1970, 1980 may each exchange information with a chipset 1990 via individual P-P interfaces 1952, 1954 using point to point interface circuits 1976, 1994, 1986, 1998. Chipset 1990 may optionally exchange information with the coprocessor 1938 via a high-performance interface 1939. In one embodiment, the coprocessor 1938 is a special-purpose processor, such as, for example, a high-throughput MIC processor, a network or communication processor, compression engine, graphics processor, GPGPU, embedded processor, or the like.

A shared cache (not shown) may be included in either processor or outside of both processors, yet connected with the processors via P-P interconnect, such that either or both processors' local cache information may be stored in the shared cache if a processor is placed into a low power mode.

Chipset 1990 may be coupled to a first bus 1916 via an interface 1996. In one embodiment, first bus 1916 may be a Peripheral Component Interconnect (PCI) bus, or a bus such as a PCI Express bus or another third generation I/O interconnect bus, although the scope of the present disclosure is not so limited.

As shown in FIG. 19, various I/O devices 1914 may be coupled to first bus 1916, along with a bus bridge 1918 which couples first bus 1916 to a second bus 1920. In one embodiment, one or more additional processor(s) 1915, such as coprocessors, high-throughput MIC processors, GPGPU's, accelerators (such as, e.g., graphics accelerators or digital signal processing (DSP) units), field programmable gate arrays, or any other processor, are coupled to first bus 1916. In one embodiment, second bus 1920 may be a low pin count (LPC) bus. Various devices may be coupled to a second bus 1920 including, for example, a keyboard and/or mouse 1922, communication devices 1927 and a storage unit 1928 such as a disk drive or other mass storage device which may include instructions/code and data 1930, in one embodiment. Further, an audio I/O 1924 may be coupled to the second bus 1920. Note that other architectures are possible. For example, instead of the point-to-point architecture of FIG. 19, a system may implement a multi-drop bus or other such architecture.

Figure 20:
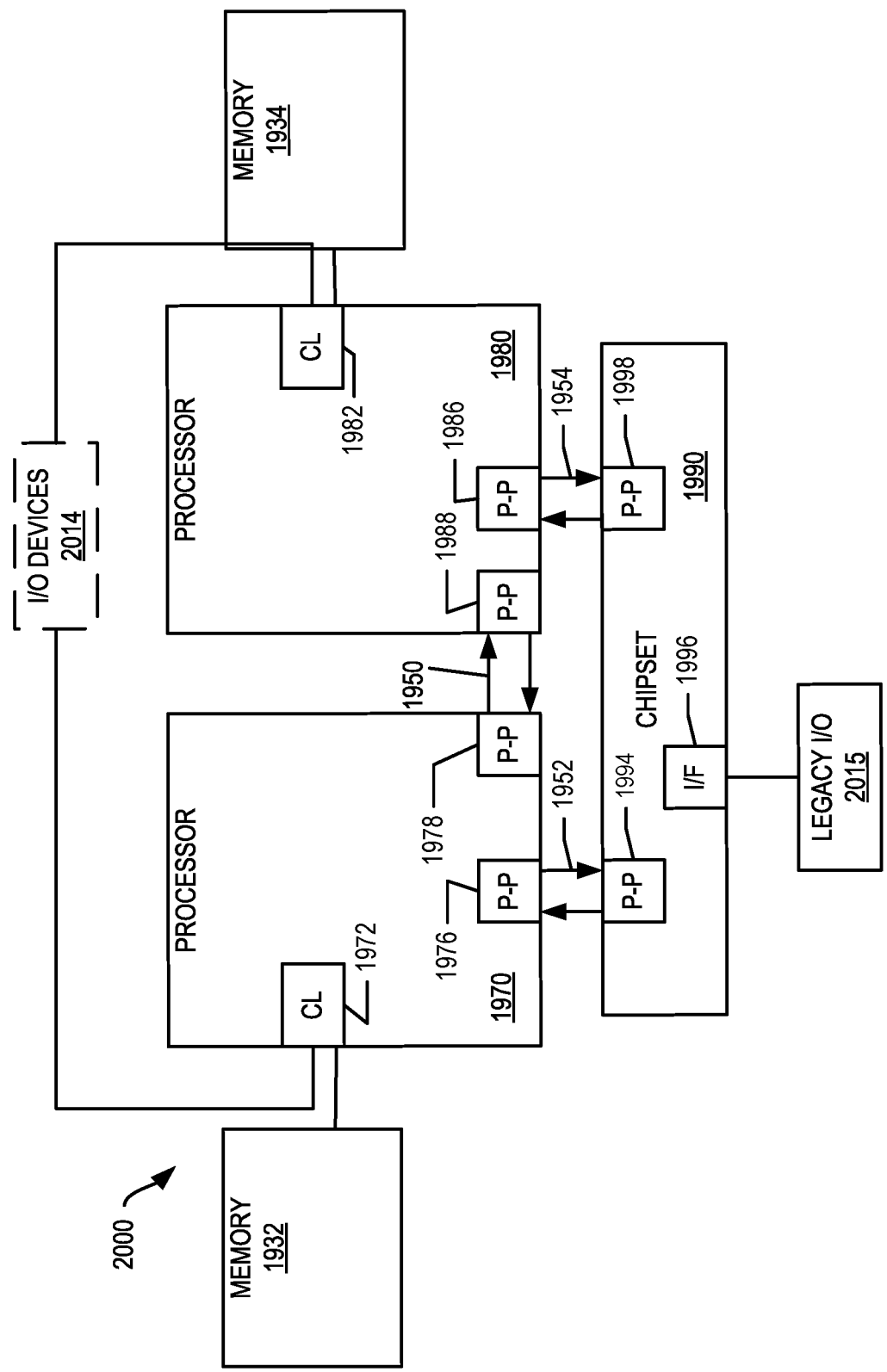
FIG. 20, shown is a block diagram of a second more specific exemplary system in accordance with an embodiment of the present disclosure.

Referring now to FIG. 20, shown is a block diagram of a second more specific exemplary system 2000 in accordance with an embodiment of the present disclosure. Like elements in FIGS. 19 and 20 bear like reference numerals, and certain aspects of FIG. 19 have been omitted from FIG. 20 in order to avoid obscuring other aspects of FIG. 20.

FIG. 20 illustrates that the processors 1970, 1980 may include integrated memory and I/O control logic ("CL") 1972 and 1982, respectively. Thus, the CL 1972, 1982 include integrated memory controller units and include I/O control logic. FIG. 20 illustrates that not only are the memories 1932, 1934 coupled to the CL 1972, 1982, but also that I/O devices 2014 are also coupled to the control logic 1972, 1982. Legacy I/O devices 2015 are coupled to the chipset 1990.

Figure 21:
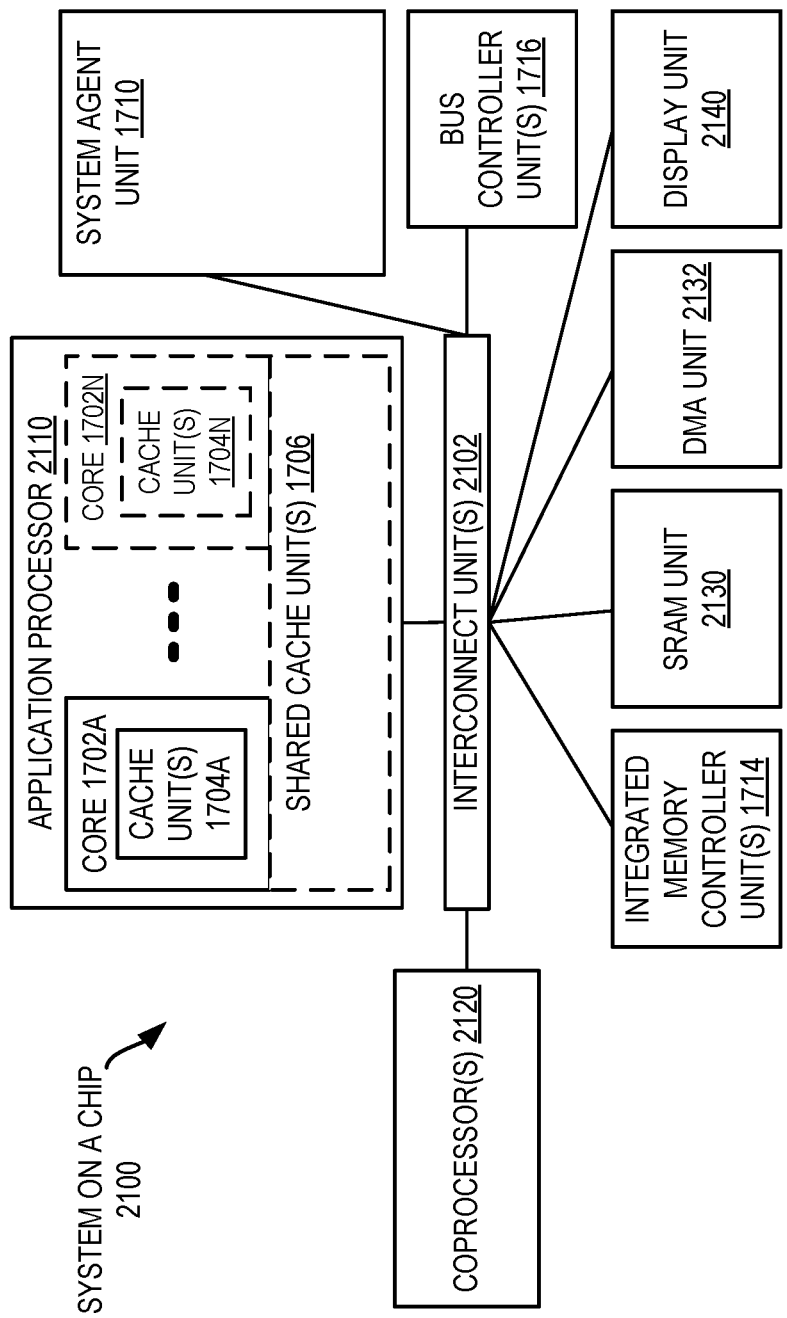
FIG. 21, shown is a block diagram of a system on a chip (SoC) in accordance with an embodiment of the present disclosure.

Referring now to FIG. 21, shown is a block diagram of a SoC 2100 in accordance with an embodiment of the present disclosure. Similar elements in FIG. 17 bear like reference numerals. Also, dashed lined boxes are optional features on more advanced SoCs. In FIG. 21, an interconnect unit(s) 2102 is coupled to: an application processor 2110 which includes a set of one or more cores 1702A-N and shared cache unit(s) 1706; a system agent unit 1710; a bus controller unit(s) 1716; an integrated memory controller unit(s) 1714; a set or one or more coprocessors 2120 which may include integrated graphics logic, an image processor, an audio processor, and a video processor; an static random access memory (SRAM) unit 2130; a direct memory access (DMA) unit 2132; and a display unit 2140 for coupling to one or more external displays. In one embodiment, the coprocessor(s) 2120 include a special-purpose processor, such as, for example, a network or communication processor, compression engine, GPGPU, a high-throughput MIC processor, embedded processor, or the like.

Embodiments (e.g., of the mechanisms) disclosed herein may be implemented in hardware, software, firmware, or a combination of such implementation approaches. Embodiments of the disclosure may be implemented as computer programs or program code executing on programmable systems comprising at least one processor, a storage system (including volatile and non-volatile memory and/or storage elements), at least one input device, and at least one output device.

Program code, such as code 1930 illustrated in FIG. 19, may be applied to input instructions to perform the functions described herein and generate output information. The output information may be applied to one or more output devices, in known fashion. For purposes of this application, a processing system includes any system that has a processor, such as, for example; a digital signal processor (DSP), a microcontroller, an application specific integrated circuit (ASIC), or a microprocessor.

The program code may be implemented in a high level procedural or object oriented programming language to communicate with a processing system. The program code may also be implemented in assembly or machine language, if desired. In fact, the mechanisms described herein are not limited in scope to any particular programming language. In any case, the language may be a compiled or interpreted language.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

Such machine-readable storage media may include, without limitation, non-transitory, tangible arrangements of articles manufactured or formed by a machine or device, including storage media such as hard disks, any other type of disk including floppy disks, optical disks, compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), phase change memory (PCM), magnetic or optical cards, or any other type of media suitable for storing electronic instructions.

Accordingly, embodiments of the disclosure also include non-transitory, tangible machine-readable media containing instructions or containing design data, such as Hardware Description Language (HDL), which defines structures, circuits, apparatuses, processors and/or system features described herein. Such embodiments may also be referred to as program products.

Emulation (Including Binary Translation, Code Morphing, Etc.)

In some cases, an instruction converter may be used to convert an instruction from a source instruction set to a target instruction set. For example, the instruction converter may translate (e.g., using static binary translation, dynamic binary translation including dynamic compilation), morph, emulate, or otherwise convert an instruction to one or more other instructions to be processed by the core. The instruction converter may be implemented in software, hardware, firmware, or a combination thereof. The instruction converter may be on processor, off processor, or part on and part off processor.

Figure 22:
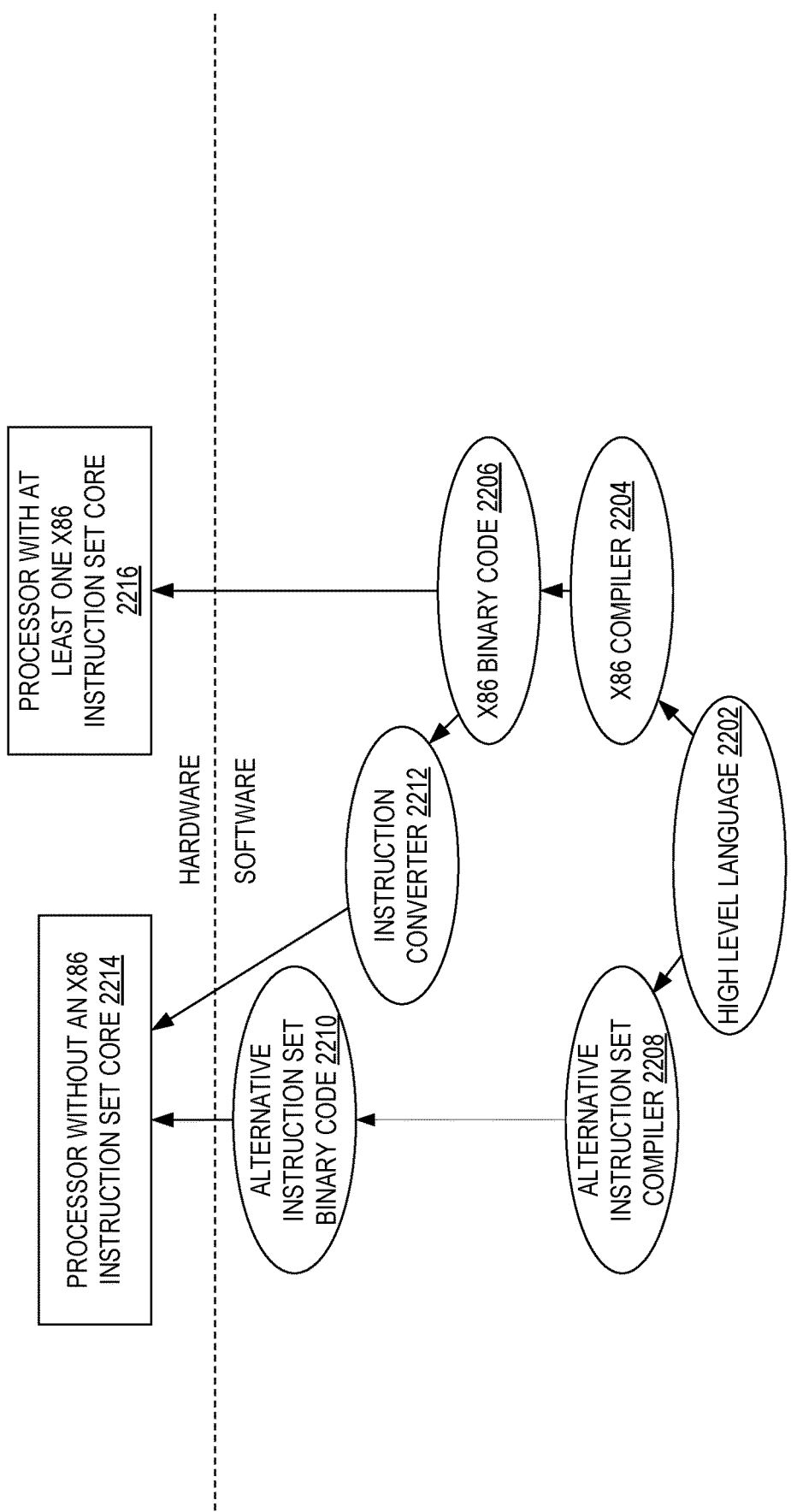
FIG. 22 is a block diagram contrasting the use of a software instruction converter to convert binary instructions in a source instruction set to binary instructions in a target instruction set according to embodiments of the disclosure.

FIG. 22 is a block diagram contrasting the use of a software instruction converter to convert binary instructions in a source instruction set to binary instructions in a target instruction set according to embodiments of the disclosure. In the illustrated embodiment, the instruction converter is a software instruction converter, although alternatively the instruction converter may be implemented in software, firmware, hardware, or various combinations thereof. FIG. 22 shows a program in a high level language 2202 may be compiled using an x86 compiler 2204 to generate x86 binary code 2206 that may be natively executed by a processor with at least one x86 instruction set core 2216. The processor with at least one x86 instruction set core 2216 represents any processor that can perform substantially the same functions as an Intel® processor with at least one x86 instruction set core by compatibly executing or otherwise processing (1) a substantial portion of the instruction set of the Intel® x86 instruction set core or (2) object code versions of applications or other software targeted to run on an Intel® processor with at least one x86 instruction set core, in order to achieve substantially the same result as an Intel® processor with at least one x86 instruction set core. The x86 compiler 2204 represents a compiler that is operable to generate x86 binary code 2206 (e.g., object code) that can, with or without additional linkage processing, be executed on the processor with at least one x86 instruction set core 2216. Similarly, FIG. 22 shows the program in the high level language 2202 may be compiled using an alternative instruction set compiler 2208 to generate alternative instruction set binary code 2210 that may be natively executed by a processor without at least one x86 instruction set core 2214 (e.g., a processor with cores that execute the MIPS instruction set of MIPS Technologies of Sunnyvale, CA and/or that execute the ARM instruction set of ARM Holdings of Sunnyvale, CA). The instruction converter 2212 is used to convert the x86 binary code 2206 into code that may be natively executed by the processor without an x86 instruction set core 2214. This converted code is not likely to be the same as the alternative instruction set binary code 2210 because an instruction converter capable of this is difficult to make; however, the converted code will accomplish the general operation and be made up of instructions from the alternative instruction set. Thus, the instruction converter 2212 represents software, firmware, hardware, or a combination thereof that, through emulation, simulation or any other process, allows a processor or other electronic device that does not have an x86 instruction set processor or core to execute the x86 binary code 2206.

What is claimed is:

1. An apparatus comprising:
a hardware processor core; and
an accelerator circuit coupled to the hardware processor core, the accelerator circuit comprising a decompressor circuit and a direct memory access circuit to:
in response to a first descriptor sent from the hardware processor core, cause the decompressor circuit to decompress compressed data from the direct memory access circuit into decompressed data and store the decompressed data in a buffer in the accelerator circuit, and
in response to a second descriptor sent from the hardware processor core separately from the first descriptor, cause the decompressed data to be written from the buffer to memory external to the accelerator circuit by the direct memory access circuit,
wherein the accelerator circuit is to write the decompressed data to a destination address in the memory specified by the second descriptor and not the first descriptor,
the second descriptor comprises at least one value that indicates the second descriptor provides the destination address for the decompressed data generated in response to the first descriptor, and
the at least one value comprises a same source address of the compressed data in the first descriptor and the second descriptor.

2. The apparatus of claim 1, wherein the accelerator circuit is to:
in response to the first descriptor sent from the hardware processor core, cause the decompressor circuit to stall decompression of the compressed data when the buffer in the accelerator circuit reaches a full threshold of the decompressed data from the decompression; and
in response to the second descriptor sent from the hardware processor core separately from the first descriptor, cause the decompressed data to be written from the buffer to the memory external to the accelerator circuit by the direct memory access circuit, and resume decompression of the compressed data.

3. The apparatus of claim 1, further comprising a second accelerator circuit comprising a second decompressor circuit and a second direct memory access circuit, wherein the accelerator circuit is to, in response to the first descriptor, lock the decompressor circuit from decompressing other compressed data.

4. The apparatus of claim 3, wherein the accelerator circuit is to, in response to the second descriptor, unlock the decompressor circuit from decompressing other compressed data after completion of decompression of the compressed data.

5. The apparatus of claim 1, wherein the hardware processor core comprises:
a decoder circuit to decode a first instruction comprising a first opcode into a decoded first instruction and decode a second instruction comprising a second opcode into a decoded second instruction, the first opcode to indicate an execution circuit is to generate the first descriptor and cause the first descriptor to be sent to the accelerator circuit, and the second opcode to indicate the execution circuit is to generate the second descriptor and cause the second descriptor to be sent to the accelerator circuit, and
the execution circuit to execute the decoded first instruction according to the first opcode to generate the first descriptor and cause the first descriptor to be sent to the accelerator circuit, and execute the decoded second instruction according to the second opcode to generate the second descriptor and cause the second descriptor to be sent to the accelerator circuit.

6. A method comprising:
sending, by a hardware processor core of a system, a first descriptor to an accelerator circuit coupled to the hardware processor core and having a decompressor circuit and a direct memory access circuit;
in response to receiving the first descriptor, decompressing compressed data from the direct memory access circuit into decompressed data by the decompressor circuit and storing the decompressed data in a buffer in the accelerator circuit;
sending, by the hardware processor core of the system, a second descriptor to the accelerator circuit separately from the first descriptor; and
in response to receiving the second descriptor, writing the decompressed data from the buffer to memory external to the accelerator circuit by the direct memory access circuit,
wherein the writing of the decompressed data is to a destination address in the memory specified by the second descriptor and not the first descriptor,
the sending the second descriptor comprises sending at least one value indicating the second descriptor provides the destination address for the decompressed data generated in response to the first descriptor, and
the at least one value comprises a same source address of the compressed data in the first descriptor and the second descriptor.

7. The method of claim 6, further comprising:
in response to receiving the first descriptor, stalling the decompressing of the compressed data by the decompressor circuit when the buffer in the accelerator circuit reaches a full threshold of the decompressed data from the decompressing; and
in response to receiving the second descriptor, writing the decompressed data from the buffer to the memory external to the accelerator circuit by the direct memory access circuit, and resuming the decompressing of the compressed data.

8. The method of claim 6, wherein the system further comprises a second accelerator circuit comprising a second decompressor circuit and a second direct memory access circuit, and further comprising, in response to receiving the first descriptor, locking the decompressor circuit from decompressing other compressed data.

9. The method of claim 8, further comprising, in response to receiving the second descriptor, unlocking the decompressor circuit from decompressing other compressed data after completion of the decompressing of the compressed data.

10. The method of claim 6, further comprising:
decoding, by a decoder circuit of the hardware processor core, a first instruction comprising a first opcode into a decoded first instruction and a second instruction comprising a second opcode into a decoded second instruction, the first opcode to indicate an execution circuit is to generate the first descriptor and cause the first descriptor to be sent to the accelerator circuit, and the second opcode to indicate the execution circuit is to generate the second descriptor and cause the second descriptor to be sent to the accelerator circuit, and executing, by the execution circuit of the hardware processor core, the decoded first instruction according to the first opcode to generate the first descriptor and cause the sending of the first descriptor to the accelerator circuit, and the decoded second instruction according to the second opcode to generate the second descriptor and cause the sending of the second descriptor to the accelerator circuit.

11. An apparatus comprising:

a hardware processor core;

a memory; and an accelerator circuit coupled to the hardware processor core and the memory, the accelerator circuit comprising a decompressor circuit and a direct memory access circuit to:

in response to a first descriptor sent from the hardware processor core, cause the decompressor circuit to decompress compressed data from the memory into decompressed data and store the decompressed data in a buffer in the accelerator circuit, and in response to a second descriptor sent from the hardware processor core separately from the first descriptor, cause the decompressed data to be written from the buffer to the memory by the direct memory access circuit, wherein the accelerator circuit is to write the decompressed data to a destination address in the memory specified by the second descriptor and not the first descriptor, the second descriptor comprises at least one value that indicates the second descriptor provides the destination address for the decompressed data generated in response to the first descriptor, and the at least one value comprises a same source address of the compressed data in the first descriptor and the second descriptor.

12. The apparatus of claim 11, wherein the accelerator circuit is to:

in response to the first descriptor sent from the hardware processor core, cause the decompressor circuit to stall decompression of the compressed data when the buffer in the accelerator circuit reaches a full threshold of the decompressed data from the decompression; and in response to the second descriptor sent from the hardware processor core separately from the first descriptor, cause the decompressed data to be written from the buffer to the memory external to the accelerator circuit by the direct memory access circuit, and resume decompression of the compressed data.

13. The apparatus of claim 11, further comprising a second accelerator circuit comprising a second decompressor circuit and a second direct memory access circuit, wherein the accelerator circuit is to, in response to the first descriptor, lock the decompressor circuit from decompressing other compressed data.

14. The apparatus of claim 13, wherein the accelerator circuit is to, in response to the second descriptor, unlock the decompressor circuit from decompressing other compressed data after completion of decompression of the compressed data.

15. The apparatus of claim 11, wherein the hardware processor core comprises:

a decoder circuit to decode a first instruction comprising a first opcode into a decoded first instruction and decode a second instruction comprising a second opcode into a decoded second instruction, the first opcode to indicate an execution circuit is to generate the first descriptor and cause the first descriptor to be sent to the accelerator circuit, and the second opcode to indicate the execution circuit is to generate the second descriptor and cause the second descriptor to be sent to the accelerator circuit, and the execution circuit to execute the decoded first instruction according to the first opcode to generate the first descriptor and cause the first descriptor to be sent to the accelerator circuit, and execute the decoded second instruction according to the second opcode to generate the second descriptor and cause the second descriptor to be sent to the accelerator circuit.

* * * * *